(12) United States Patent
Okumura et al.

(10) Patent No.: US 6,177,646 B1
(45) Date of Patent: Jan. 23, 2001

(54) METHOD AND DEVICE FOR PLASMA TREATMENT

(75) Inventors: Tomohiro Okumura; Ichiro Nakayama, both of Kadoma; Shozo Watanabe, Moriguchi; Hideo Haraguchi, Toyonaka, all of (JP)

(73) Assignee: Matsushita Electric Industrial Co, Ltd., Osaka (JP)

( * ) Notice: Under 35 U.S.C. 154(b), the term of this patent shall be extended for 0 days.

(21) Appl. No.: 09/180,974
(22) PCT Filed: Mar. 16, 1998
(86) PCT No.: PCT/JP98/01089
  § 371 Date: Nov. 17, 1998
  § 102(e) Date: Nov. 17, 1998
(87) PCT Pub. No.: WO98/42012
  PCT Pub. Date: Sep. 24, 1998

(30) Foreign Application Priority Data

Mar. 17, 1997 (JP) .................................................. 9-062993
Jul. 28, 1997 (JP) .................................................. 9-201272

(51) Int. Cl.[7] ...................................................... B23K 9/00
(52) U.S. Cl. ...................................... 219/121.43; 156/345
(58) Field of Search ...................... 219/121.43; 156/345; 216/48, 70; 438/729; 118/723 MW, 723 AN; 315/111.51; 174/117 FF

(56) References Cited

U.S. PATENT DOCUMENTS

| | | | |
|---|---|---|---|
| 4,948,458 | * 8/1990 | Ogle | 438/729 |
| 5,277,751 | * 1/1994 | Ogle | 216/70 |
| 5,362,350 | * 11/1994 | Yanagida | 216/48 |
| 5,587,038 | * 12/1996 | Cecchi et al. | 156/345 |
| 5,650,032 | * 7/1997 | Keller et al. | 156/345 |
| 5,735,993 | * 4/1998 | Yoshida | 156/345 |
| 5,922,223 | * 7/1999 | Okumura et al. | 219/121.43 |

FOREIGN PATENT DOCUMENTS

| | | |
|---|---|---|
| 5-502971 | 5/1993 | (JP) . |
| 7-29888 | 1/1995 | (JP) . |
| 0 650 182 | 4/1995 | (JP) . |
| 7-183283 | 7/1995 | (JP) . |
| 7-221079 | 8/1995 | (JP) . |
| 09199487 | 7/1997 | (JP) . |
| 91/10341 | 7/1991 | (WO) . |

* cited by examiner

Primary Examiner—Teresa Walberg
Assistant Examiner—Quang Van
(74) Attorney, Agent, or Firm—Wenderoth, Lind & Ponack, L.L.P.

(57) ABSTRACT

Plasma is generated in a vacuum chamber (1) by supplying high frequency power to a spiral antenna (5) from an antenna-use high frequency power source (4) and by supplying high frequency power to an electrode (6) by an electrode-use high frequency power source (8) in a state where evacuating a vacuum chamber (1) while introducing a specified gas into the vacuum chamber, thereby controlling the vacuum chamber at a predetermined pressure. Plasma processing such as etching is performed on a substrate (7) located on the electrode (6), the interior of the vacuum chamber is heated to 80° C. or higher, wherein a resistance-heating heater (11) constituted of a heating element shielded from electromagnetic waves by a conductive sheath and a pressure-weld type thermocouple (10) provided on a dielectric body (9) are connected to a temperature adjuster (12). A insulating material (13) is arranged between the heater (11) and the antenna (5), and an inner chamber (16) including a belt heater (22) is also arranged.

39 Claims, 14 Drawing Sheets

METHOD AND DEVICE FOR PLASMA TREATMENT

DESCRIPTION

1. Technical Field

The present invention relates to a method and an apparatus for plasma processing, e.g., dry etching, sputtering, plasma CVD, etc. and more particularly to a method and an apparatus for plasma processing of a high frequency induction type.

2. Background Art

Plasma processing in a high vacuum has been required lately to achieve processing with a high aspect ratio in dry etching or embedding with a high aspect ratio in plasma CVD to meet a trend towards minute semiconductor elements.

For instance, if high-density plasma is produced in a high vacuum in dry etching, a probability of ions colliding against neutral gas particles or the like in an ion sheath formed at a substrate surface is decreased, so that the ions are uniform in direction to the substrate. Moreover, an increased degree of electrolytic dissociation increases a ratio of ions reaching the substrate to an entering-particle flux of neutral radicals. Etching anisotropy is eventually enhanced, thereby accomplishing processing with a high aspect ratio.

In plasma CVD, when high-density plasma is produced in a high vacuum, a fine pattern is embedded and smoothed owing to a sputtering effect by ions, thus allowing processing with a high aspect ratio.

Some systems of plasma processing apparatuses that can generate high-density plasma in the high vacuum are proposed. FIG. 22 is a sectional view of a plasma processing apparatus having a spoke antenna type plasma source. In FIG. 22, a vacuum chamber 1 is evacuated by a pump 3 while a predetermined gas is introduced from a gas feed unit 2 to the vacuum chamber 1, thereby to maintain the interior of the vacuum chamber 1 at a predetermined pressure. In this state, a high frequency power of 500 MHz is supplied from a high frequency power source 4 the for antenna to a spoke antenna 5 on a dielectric body 9. In consequence, plasma is generated in the vacuum chamber 1, subjecting a substrate 7 placed on an electrode 6 to plasma processing such as etching, deposition, or surface modification. At this time, as shown in FIG. 22, the ion energy reaching the substrate 7 can be controlled by feeding high frequency power to the electrode 6 as well from a high frequency power source 8 for the electrode. This system is described in detail in "New Ultra-High-Frequency Plasma Source for Large-Scale Etching Processes", Jpn.J.Appln.Phys., Vol.34, Pt.1, No.12B (1995) by S. Samukawa et al.

FIG. 23 is a perspective view of a spiral antenna type plasma processing apparatus proposed earlier by the present inventors. In FIG. 23, the vacuum chamber 1 is evacuated by the pump 3 while a predetermined gas is fed from the gas feed unit 2 to the vacuum chamber 1, so that the vacuum chamber 1 is kept at a predetermined pressure. In the state above, when a high frequency power of 100 MHz is supplied from the high frequency power source 4 to the spiral antenna 5 placed on the dielectric body 9, plasma is generated in the vacuum chamber 1, the substrate 7 placed on the electrode 6 can be subjected to plasma processing such as etching, deposition, or surface modification. The high frequency power source 8 is provided to supply high frequency power to the electrode 6, so that the ion energy reaching the substrate 7 can be controlled.

In the conventional systems shown in FIGS. 22 and 23, a large quantity of reaction product is accumulated on the dielectric body 9, leading to such issues as the generation of dust, shortening of a maintenance cycle, etc. Moreover, there is an issue that an ambience in the vacuum chamber 1 is not stable, rendering plasma processing poorly reproducible. The reason for this will be detailed below.

In the case of plasma CVD, a thin film is also deposited on the dielectric body 9 in a process of forming a thin film on the substrate 7. Also, when dry etching, a substance resulting from an etching reaction or vapor phase reaction is sometimes turned to a thin film on the dielectric body 9. The film is increased in thickness through repeated processings. When the film exceeds a certain thickness, the film comes off due to a film stress and falls as dust onto the substrate 7. Since the dust is given to rise even by processing of only a small count of substrates 7, inconveniently, the dielectric body 9 is frequently cleaned with pure water, ethanol or the like in the conventional systems of FIGS. 22 and 23.

Through repetition of processings, the thickness of the above deposited film is changed, consequently a adsorption rate of radicals is changed, and the ambience in the vacuum chamber 1, namely, a partial pressure of reaction species is changed, thus worsening reproducibility of plasma processing. A temperature rise of the dielectric body 9 when heated by high energy ions colliding thereto is another cause of the change of the absorption rate of radicals.

A method and an apparatus capable of solving the above-described issues are already realized in an inductive coupling type plasma processing apparatus, which will be specifically described with reference to FIGS. 24–25 and 21. FIG. 24 is a perspective view and FIG. 25 is a sectional view of the plasma processing apparatus. FIG. 21 is a detailed plan view of a flat heater. In FIGS. 24 and 25, the vacuum chamber 1 is evacuated by the pump 3 while a predetermined gas is introduced into the vacuum chamber 1 from the gas feed unit 2, so that the vacuum chamber 1 is kept at a predetermined pressure. During this time, when high frequency power is supplied from the discharge coil-use high frequency power source 4 to a flat spiral discharge coil 21, plasma is generated in the vacuum chamber 1 and the substrate 7 placed on the electrode 6 is plasma-processed, e.g., etched, or subjected to deposition process or surface modification, etc. In this case, if high frequency power is also sent to the electrode 6 from the electrode-use high frequency power source 8 as indicated in FIGS. 24 and 25, the ion energy reaching the substrate 7 can be controlled. A pressure-weld type thermocouple 10 set to the dielectric body 9 and a flat heater 411 are connected to a heater temperature regulator 12 to adjust the dielectric body 9 at a required temperature. An insulating material 13 is disposed between the flat heater 411 and flat spiral discharge coil 21 so as to prevent the discharge coil 21 from being excessively heated. As shown in FIG. 21, in order to pass the electromagnetic waves generated by the supply of high frequency power to the coil 21 through a heat generating body 400 of the flat heater 411, a portion of one face of the dielectric body 9 which is shielded with the heating element of the flat heater 411 to prevent passage of the electromagnetic waves therethrough is not larger than 40% the total area of the one face of the dielectric body 9. An inner chamber 16 with a belt heater 22 is further installed in the vacuum chamber, and therefore the apparatus is so constructed that not only the dielectric body 9, but almost every part of the apparatus in touch with the plasma can be heated.

Many substrates, each with a silicon oxide film, are etched with the use of the above apparatus under the conditions that the kind and flow rate of the gas, pressure, high frequency power impressed to the flat spiral discharge coil, and high frequency power impressed to the electrode are respectively $C_4F_8/H_2$=50/15 sccm, 10 mTorr, 1000W and 300W. When the flat heater 411 is not provided in the apparatus, the dielectric body 9 gradually increases in temperature through repetition of processes. On the other hand, when the flat heater 411 is provided and a set temperature is not lower than 80° C., the dielectric body 9 is changed within the set temperature plus or minus 15° C. even through repeated processings, that is, the dielectric body 9 shows good temperature stability. Without the flat heater 411, a lot of dust starts to fall on the substrates 7 after 15 substrates are processed. In contrast, when the dielectric body 9 is set at 80° C. or higher by the provision of the flat heater 411, hardly any dust falls on the substrates 7 even when 100 substrates are processed. While an etching speed reproducibility when 15 substrates are continuously processed in the absence of the flat heater 411 is ±8%, the etching speed reproducibility is ±2% when the dielectric body 9 is set at 80° C. with the flat heater 411. The technique is described in detail in Japanese Patent Application No. 7-297993.

If the flat heater used in the inductive coupling type plasma processing apparatus shown in FIGS. 24–25 and 21 is applied to the antenna plasma processing apparatus shown in FIGS. 22 or 23, the electromagnetic waves are absorbed by the heat generating body of the flat heater, and as a result, not only is the heat generating body greatly raised in temperature due to induction heating, but the plasma density is considerably lowered in comparison with the case without the flat heater. Since the phenomenon of a large heat loss at the heater is not detected in the inductive coupling type plasma processing apparatus, it is assumed to result from a difference of frequencies of electromagnetic waves. That is, while the inductive coupling type plasma processing apparatus uses 13.56 MHz high frequency power, the spoke antenna type plasma processing apparatus and the spiral antenna type plasma processing apparatus use 500 MHz and 100 MHz high frequency power, respectively.

How the electromagnetic waves are absorbed at the flat heater is determined by changing the frequency of the high frequency power supplied to the coil of the inductive coupling type plasma processing apparatus from 1 to 100 MHz. It is detected by doing this that much more of the electromagnetic waves are absorbed at 30 MHz or higher frequencies. In using a 100 MHz or higher therefore, the absorption of electromagnetic waves at the flat heater raises an issue, as is clearly and easily estimated from the example of the spoke antenna type plasma processing apparatus.

The present invention has been devised to solve the above-described issues in the prior art and has for its object to provide a method and an apparatus for plasma processing with little generation of dust and having low maintenance frequency and superior reproducibility of plasma processing without a large heat loss at a heater.

SUMMARY OF THE INVENTION

In accomplishing these and other aspects, the present invention is constructed as follows.

According to a first aspect of the present invention, there is provided a plasma processing method which comprises evacuating a vacuum chamber while supplying a gas into the vacuum chamber, thereby controlling the vacuum chamber at a predetermined pressure; supplying high frequency power to an antenna; radiating electromagnetic waves into the vacuum chamber via a dielectric body; producing plasma in the vacuum chamber; and processing a substrate placed on an electrode in the vacuum chamber. Wherein the dielectric body is heated to 80° C. or higher by feeding a current to a resistance-heating heater including a heat generating body shielded from the electromagnetic waves by a conductive sheath.

According to a second aspect of the present invention, there is provided a plasma processing method which comprises evacuating the vacuum chamber while supplying the gas into the vacuum chamber, thereby controlling the vacuum chamber at a predetermined pressure; supplying high frequency power to a coil arranged along a dielectric body; producing plasma in the vacuum chamber; and processing a substrate placed on an electrode in the vacuum chamber. Wherein the dielectric body is heated to 80° C. or higher by feeding a current to a resistance-heating heater including a heating element shielded from the electromagnetic waves by a conductive sheath.

According to a third aspect of the present invention, there is provided a plasma processing method according to the first or second aspect, wherein the gas is halogenated hydrogen gas, or halogenated boron gas, or carbon fluoride gas such as $CF_4$, $C_4F_8$ or the like, or gas containing hydrogen, carbon, fluorine such as $CHF_3$, $CH_2F_2$ or the like.

According to a fourth aspect of the present invention, there is provided a plasma processing method according to any one of the first through third aspects, wherein the plasma processing is etching using an organic thin film as a mask.

According to a fifth aspect of the present invention, there is provided a plasma processing method according to any one of the first through fourth aspects, wherein a frequency of the high frequency power supplied to the antenna is 30 MHz–3 GHz.

According to a sixth aspect of the present invention, there is provided a plasma processing method according to any one of the first through fifth aspects, wherein an expression Sy×0.6>Sh is held, where Sy is a total area of one face of the dielectric body, and Sh is an area of a part of the one face of the dielectric body which is shielded by the resistance-heating heater not to pass the electromagnetic waves through.

According to a seventh aspect of the present invention, there is provided a plasma processing method according to any one of the first through sixth aspects, wherein an electric resistivity of a conductor constituting the conductive sheath is $3 \times 10^{-8} \Omega \cdot m$ or lower.

According to an eighth aspect of the present invention, there is provided a plasma processing method according to the seventh aspect, wherein the conductor constituting the conductive sheath is gold, silver, copper, or aluminum.

According to a ninth aspect of the present invention, there is provided a plasma processing method according to any one of the first through eighth aspects, wherein a pressure-weld type thermocouple is fitted at a side face of the dielectric body thereby to adjust a temperature of the dielectric body while monitoring the temperature.

According to a 10th aspect of the present invention, there is provided a plasma processing apparatus:
  a sevice for supplying a gas into a vacuum chamber;
  a deviec for evacuating the vacuum chamber; an antenna; which comprises a device for supplying a gas into a vacuum chamber; a device for evacuating the vacuum chamber; and an antenna; the device also has a high frequency power source which can supply high frequency power to the antenna; an electrode for placing a substrate thereon; and a dielectric body for introducing electromagnetic waves radiated form the antenna into the vacuum chamber. Further, the device has a resistance-heating heater for heating the dielectric body which includes a heat generating body shielded from the electromagnetic waves by means of a conductive sheath; and a heater-use power source for feeding a current to the resistance-heating heater.

According to an 11th aspect of the present invention, there is provided a plasma processing apparatus which comprises a device for supplying a gas into a vacuum chamber; a device for evacuating the vacuum chamber; and an electrode for placing a substrate thereon in the vacuum chamber. The device also has a coil for generating plasma in the vacuum chamber; a dielectric body on which the coil is arranged; and a high frequency power source for supplying high frequency power to the coil. Further, the device has a resistance-heating heater for heating the a high frequency power source which can supply high frequency power to the antenna;

an electrode for placing a substrate thereon; a dielectric body for introducing electromagnetic waves radiated from the antenna into the vacuum chamber;

a resistance-heating heater for heating the dielectric body which includes a heat generating body shielded from the electromagnetic waves by means of a conductive sheath; and a heater-use power source for feeding a current to the resistance-heating heater.

According to a 11th aspect of the present invention, there is provided a plasma processing apparatus which comprises:

a device for supplying a gas into a vacuum chamber;

a device for evacuating the vacuum chamber;

an electrode for placing a substrate thereon in the vacuum chamber;

a coil for generating plasma in the vacuum chamber;

a dielectric body on which the coil is arranged;

a high frequency power source for supplying high frequency power to the coil;

a resistance-heating heater for heating the dielectric body; and a heater-use power source for feeding a current to the resistance-heating heater including a heating element shielded from the electromagnetic waves by means of a conductive sheath.

According to a 12th aspect of the present invention, there is provided a plasma processing apparatus according to the 10th or 11th aspect, wherein a frequency of the high frequency power supplied to the antenna is 30 MHz–3 GHz.

According to a 13th aspect of the present invention, there is provided a plasma processing apparatus according to any one of the 10th–12th aspects, wherein an expression $Sy \times 0.6 > Sh$ is held where Sy is a total area of one face of the dielectric body and Sh is an area of a part of the one face of the dielectric body which is shielded by the resistance-heating heater not to pass the electromagnetic waves through.

According to a 14th aspect of the present invention, there is provided a plasma processing apparatus according to any one of the 10th–13th aspects, wherein an electric resistivity of a conductor constituting the conductive sheath is $3 \times 10^{-8} \Omega \cdot m$ or lower.

According to a 15th aspect of the present invention, there is provided a plasma processing apparatus according to any one of the 10th–14th aspects, wherein the conductor constituting the conductive sheath is gold, silver, copper, or aluminum.

According to a 16th aspect of the present invention, there is provided a plasma processing apparatus according to any one of the 10th–15th aspects, wherein a pressure-weld type thermocouple is fitted at a side face of the dielectric body thereby to adjust a temperature of the dielectric body while monitoring the temperature.

According to a 17th aspect of the present invention, there is provided a plasma processing method according to the second aspect, wherein, the substrate is processed in the plasma produced in a state where the dielectric plate is heated by a heater generating heat except at a central part and electrostatic coupling between the coil and the plasma is weakened by a Faraday shield at the central part.

According to a 18th aspect of the present invention, there is provided a plasma processing method according to the 17th aspect, wherein high frequency power is supplied to the electrode.

According to a 19th aspect of the present invention, there is provided a plasma processing method according to the 17th or 18th aspect, wherein the central part is a part for preventing a temperature rise as a result of a concentration of heat by the heater and for restricting heat generation so as to enhance thermal uniformity of the dielectric body.

According to a 20th aspect of the present invention, there is provided a plasma processing method according to any one of the 17th–19th aspects, wherein the central part occupies 5–20% a total area of the dielectric body.

According to a 21st aspect of the present invention, there is provided a plasma processing apparatus according to the 11th aspect. Wherein a heat generating body of the resistance-heating heater is almost uniformly disposed almost over all of a surface of the dielectric plate including the vicinity of the center of the dielectric body, and the current from the heater power source is adapted not to flow to a heat generating body in the vicinity of the center of the dielectric plate.

According to a 22nd aspect of the present invention, there is provided a plasma processing apparatus according to the 11th aspect, wherein a heat generating body of the resistance-heating heater is almost uniformly disposed almost over all of a surface of the dielectric plate except the vicinity of the center of the dielectric plate, and a low resistance conductor located in the vicinity of the center of the dielectric plate is connected to the heat generating body of the resistance-heating heater.

According to a 23rd aspect of the present invention, there is provided a plasma processing apparatus according to the 21st or 22nd aspect, further comprising a device for feeding high frequency power to the electrode.

According to a 24th aspect of the present invention, there is provided a plasma processing apparatus according to any one of the 21st–23rd aspects, wherein the coil is partly or totally made of multi spirals.

According to a 25th aspect of the present invention, there is provided a plasma processing apparatus according to any one of the 21st–24th aspects, wherein the central part is a part for preventing a temperature rise as a result of the concentration of heat by the heater and for restricting heat generation so as to enhance thermal uniformity of the dielectric body.

According to a 26th aspect of the present invention, there is provided a plasma processing apparatus according to any one of the 21st–25th aspects, wherein the central part occupies 5–20% a total area of the dielectric body.

According to the plasma processing method of the present invention, while the vacuum chamber is evacuated with the gas being fed thereinto, thereby to control the vacuum chamber at a predetermined pressure, the high frequency power is supplied to the antenna, whereby the electromagnetic waves are radiated into the vacuum chamber via the dielectric body and then, plasma is produced in the vacuum chamber. The substrate placed on the electrode in the vacuum chamber is processed in this manner. In this method, the dielectric body is heated to 80° C. or higher by feeding a current to the resistance-heating heater constituted of the heat generating body shielded from the electromagnetic waves by the conductive sheath. Therefore, in comparison with the case without heating the dielectric body, the thickness of the thin film deposited on the dielectric body becomes remarkably reduced. Moreover, the film becomes finer as compared with the case where the dielectric body is low in temperature. Because of the above arrangement, dust is restricted and the maintenance frequency for the dielectric body is remarkably decreased. Since even when the processing is repeated, the thickness change of the deposited film is small, and the dielectric body is kept at the high temperature, the adsorption rate of radicals remains low. Accordingly, the ambience in the vacuum chamber, namely, the partial pressure of reaction species is stable, accomplishing plasma processing with superior reproducibility. In addition, since the heat generating body of the resistance-heating heater is almost perfectly shielded from the electromagnetic waves by the conductive sheath, the heat loss is limited.

According to the present invention, the plasma processing apparatus comprises the device for supplying the gas into the vacuum chamber, the device for evacuating the vacuum chamber, the antenna, the high frequency power source for supplying high frequency power to the antenna, the electrode for placing the substrate thereon, the dielectric body for introducing electromagnetic waves radiated from the antenna into the vacuum chamber, the resistance-heating heater for heating the dielectric body, and the heater-use power source for feeding the current to the resistance-heating heater. Since the resistance-heating heater is constituted of the heat generating body shielded from the electromagnetic waves by the conductive sheath, the thickness of the thin film deposited on the dielectric body is considerably small in comparison with the case without heating the dielectric body. At the same time, in comparison with the case where the dielectric body is at low temperatures, the film is finer in quality, the generation of dust is suppressed, and maintenance frequency for the dielectric body is remarkably low. Even after the processing is repeatedly conducted, the film thickness of the deposited film changes little and the dielectric body is maintained at the high temperature, so that the adsorption rate of radicals is still low, and does not change greatly. The ambience in the vacuum chamber, that is, the partial pressure of the reaction species is stable, and accordingly, plasma processing with superior reproducibility can be accomplished. The heat generating body of the resistance-heating heater is nearly completely shielded against the electromagnetic waves owing to the conductive sheath, and the heat loss is greatly limited.

According to the plasma processing method, while the gas is supplied into the vacuum chamber, the vacuum chamber is evacuated to control the interior of the vacuum chamber at a predetermined pressure. At this time, high frequency power is fed to the coil disposed along the dielectric plate, thereby generating plasma in the vacuum chamber and processing the substrate loaded on the electrode in the vacuum chamber. In the method, the dielectric plate is heated by the heater which generates heat except at the central part thereof. At the same time, the electrostatic coupling between the coil and the plasma is weakened by the Faraday shield at the central part. Since the method is designed to process the substrate in the above state, the dielectric plate can be heated with good thermal uniformity and prevented from being sputtered in the vicinity of the center thereof.

According to the plasma processing apparatus, the apparatus is provided with the device for feeding the gas into the vacuum chamber, the device for evacuating the vacuum chamber, the electrode for setting the substrate in the vacuum chamber, the coil for generating the plasma in the vacuum chamber, the dielectric plate where the coil is disposed, the device for supplying high frequency power to the coil, the resistance-heating heater for heating the dielectric plate, and the heater power source for feeding the current to the resistance-heating heater. The heat generating body of the resistance-heating heater is almost uniformly arranged nearly over all of the surface of the dielectric plate including the vicinity of the center of the plate, and moreover the current from the heater power source is adapted not to flow to the heat generating body in the vicinity of the center of the dielectric plate. Accordingly, the dielectric plate can be heated uniformly and prevented from being sputtered in the vicinity of the center thereof.

According to the plasma processing apparatus, there are provided the device for feeding the gas into the vacuum chamber, the device for evacuating the vacuum chamber, the electrode for setting the substrate in the vacuum chamber, the coil for generating the plasma in the vacuum chamber, the dielectric plate where the coil is disposed, the device for supplying high frequency power to the coil, the resistance-heating heater for heating the dielectric plate, and the heater power source for feeding the current to the resistance-heating heater. The heat generating body of the resistance-heating heater is almost uniformly arranged nearly over all of the surface of the dielectric plate except the vicinity of the center of the plate, and moreover the low resistance conductor installed in the vicinity of the center of the dielectric plate is connected to the heat generating body of the resistance-heating heater. Accordingly, the dielectric plate can be uniformly heated and prevented from being sputtered in the vicinity of the center thereof.

In the apparatus, if the coil is partly or wholly constituted of multi-spirals, an inductance of the spiral coil becomes remarkably small. The thus-constituted plasma processing apparatus exerts superior matching characteristics. The effect of the multi-spiral coil is detailed in "New inductively coupled plasma source using a multispiral coil" of Rev. Sci. Instrum. 66(11), 1995 by T. Okumura and I. Nakayama.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
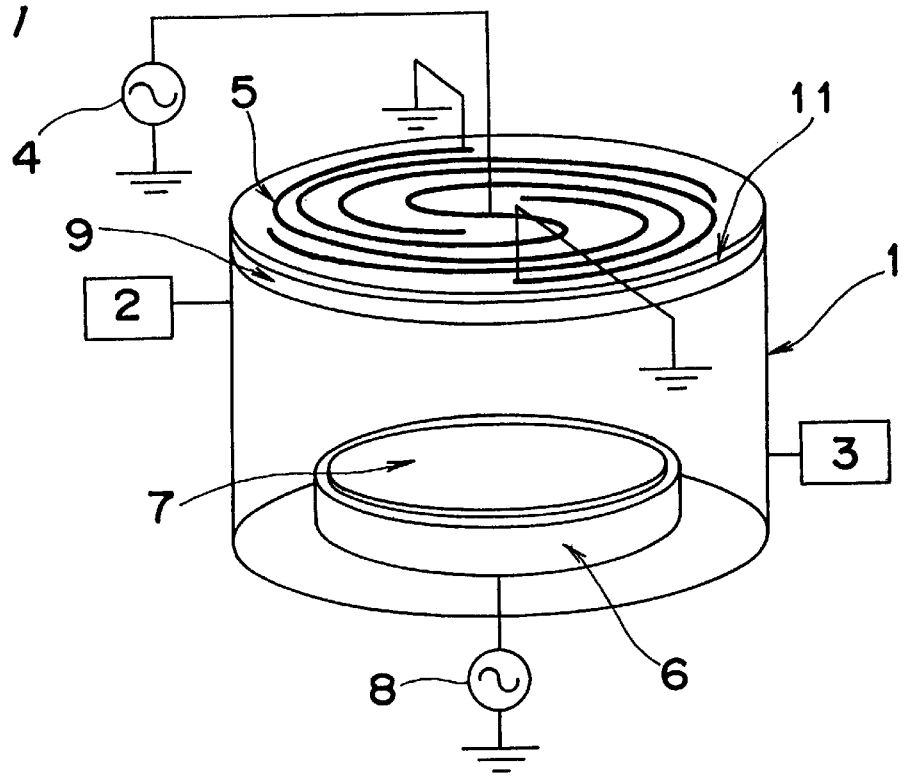
FIG. 1 is a perspective view showing a schematic constitution of a plasma processing apparatus used in a first embodiment of the present invention.

Before the description of the present invention proceeds, it is to be noted that like parts are designated by like reference numerals throughout the accompanying drawings.

A first embodiment of the present invention will be described in detail with reference to figures.

A first embodiment of the present invention will be described with reference to FIGS. 1–5.

Figure 2:
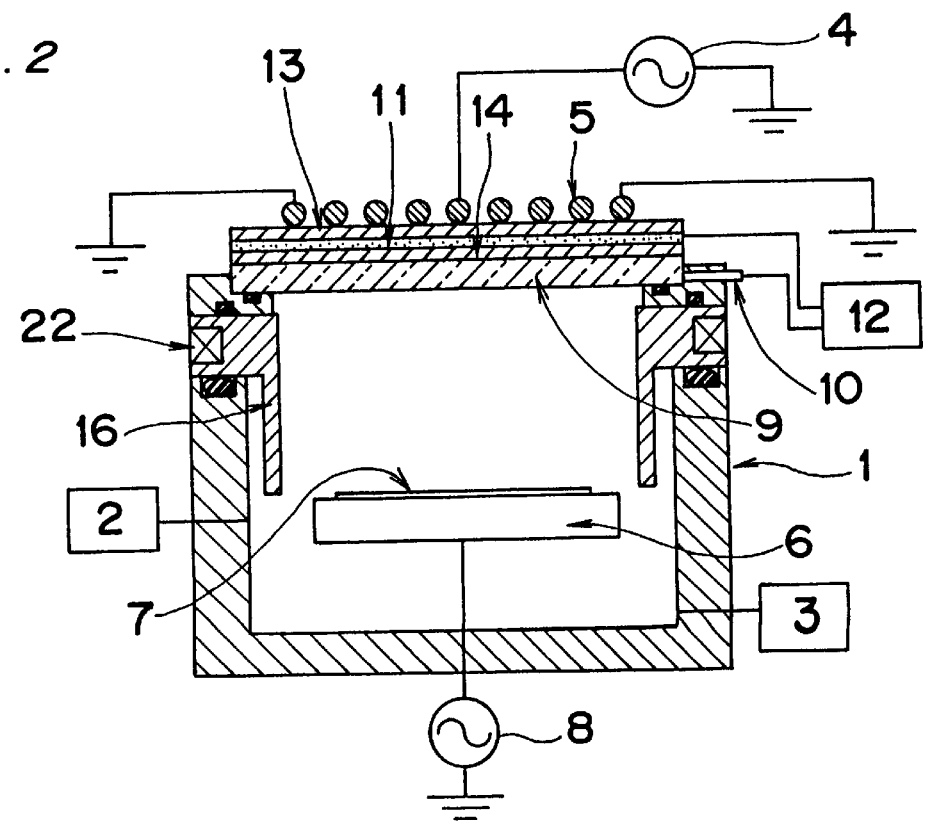
FIG. 2 is a sectional view showing the constitution of the plasma processing apparatus used in the first embodiment of the present invention in FIG. 1.
Figure 3:
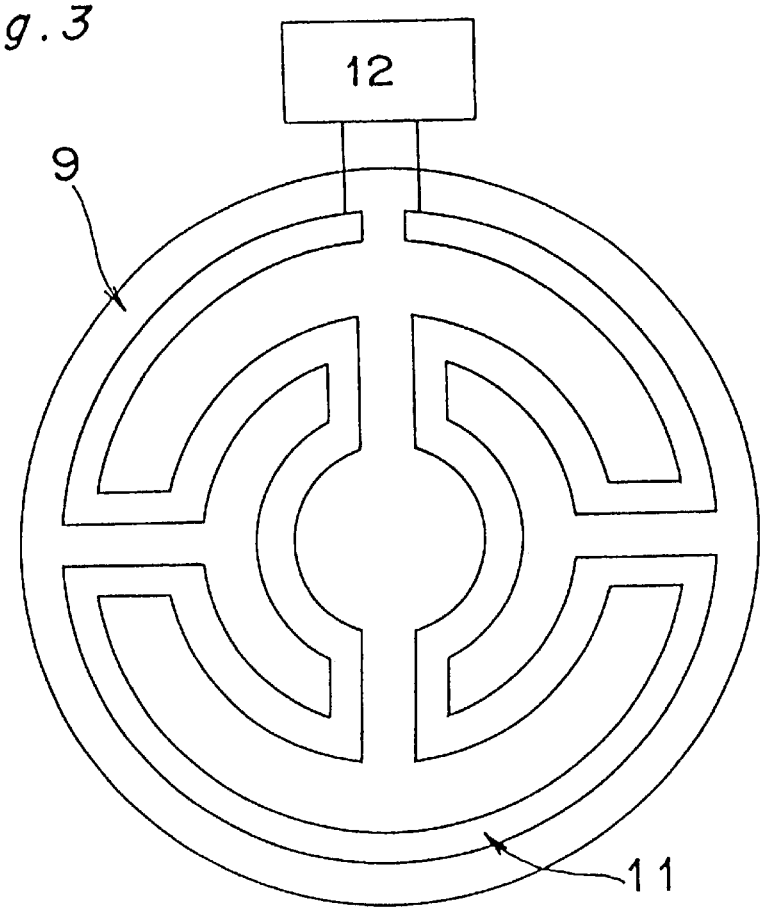
FIG. 3 is a plan view showing a constitution of a resistance-heating heater used in the first embodiment of the present invention in FIG. 1.

The constitutional view of a plasma processing apparatus used in the first embodiment of the present invention are shown in FIGS. 1–4. FIG. 1 is a perspective view, FIG. 2 is a sectional view of the plasma processing apparatus, and FIG. 3 is a detailed plan view of a resistance-heating heater of the plasma processing apparatus. In FIGS. 1 and 2, a vacuum chamber 1 is evacuated by a pump 3 while a predetermined gas is introduced into the chamber 1 from a gas feed unit 2, thereby to maintain the vacuum chamber 1 at a predetermined pressure. In the above state, when high frequency power is impressed from a high frequency power source 4 an antenna to a spiral antenna 5, plasma is produced in the vacuum chamber 1, so that a substrate 7 placed on an electrode 6 can be processed by plasma processing such as etching, deposition, or surface modification. As shown in FIGS. 1 and 2, high frequency power is also supplied at this time to the electrode 6 from a high frequency power source 8 for the electrode to control ion energy reaching the substrate 7. A pressure-weld type thermocouple 10 set to a dielectric body 9 and a resistance-heating heater 11 are connected to a heater temperature regulator 12 as one example of a power source for a heater for supplying a current through the resistance-heating heater. The current flowing through the resistance-heating heater is controlled, so that the dielectric body 9 can be regulated at a required temperature. An insulating material 13 is inserted between the heater 11 and the spiral antenna 5 so as to prevent the spiral antenna 5 from being overheated. Moreover, an insulating material 14 is provided between the heater 11 and the dielectric body 9 so as to heat the dielectric body 9 with good thermal uniformity.

As indicated in FIG. 3, if a total area of one face of the dielectric body 9 is Sy and, an area of a part of the one face of the dielectric body 9 shielded by the heater 11 and consequently not allowing the electromagnetic waves to pass through is Sh, a relation of Sy×0.6>Sh is maintained. According to this construction, since the electromagnetic waves radiated from the spiral antenna 5 sufficiently passes through the vacuum chamber 1, it is possible to maintain discharging. The inventors found that if the above relation is not held, the discharge becomes instable and high frequency reflection power is adversely generated and thus discharging might not be maintained. Further, as shown in FIG. 2, an inner chamber 16 with a belt heater 22 is provided in the vacuum chamber 1. Therefore, the plasma processing apparatus is constructed so that not only the dielectric body 9, but almost any part in touch with the plasma can be heated.

Figure 4:
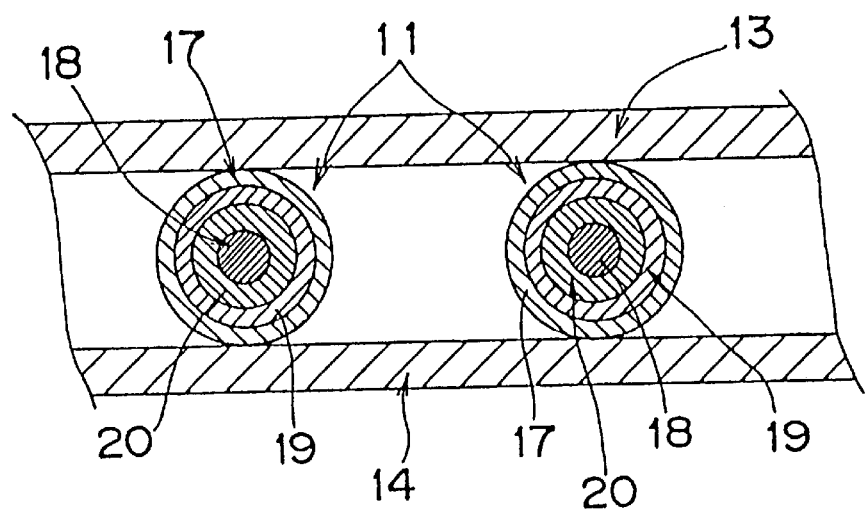
FIG. 4 is an enlarged sectional view of the constitution of the resistance-heating heater used in the first embodiment of the present invention in FIG. 1.

FIG. 4 is a sectional view showing the resistance-heating heater 11 in detail. As is clearly shown in FIG. 4, the resistance-heating heater 11 is adapted to heat the dielectric body 9 when a current is fed to a heat generating body 18 shielded from the electromagnetic waves by a conductive sheath 17. The conductive sheath 17 is obtained by silver-plating a surface of a stainless sheath 19 and is electrically insulated from the heat generating body 18 by means of an insulating material 20. The silver plating is 50 μm thick, which is sufficient to prohibit the electromagnetic waves radiated from the spiral antenna 5 from entering the silver plating because a skin depth of 100 MHz electromagnetic waves to silver is approximately 7 μm.

Here, when an electric field is or magnetic field is penetrates a conductor, a depth having a value of 1/e (e denotes a base of a natural logarithm and nearly equals to 2.7) is called "skin depth". The skin depth δ is represented by:

$$\delta = 1/\sqrt{(\pi f \mu \sigma)}$$

where f is a frequency of electromagnetic waves, μ is a magnetic permeability of the conductor, σ is a conductive rate of the conductor. For example, when the conductor is made of silver, a case of f=100 MHz is considered herein. Then, since $\mu = 4\pi \times 10^{-7}$[H/m] and $\sigma = 6.1 \times 10^{7}$[$\Omega^{-1}$·m], $\delta = 6.4 \times 10^{-6}$[m]=6.4[μm].

Therefore, since it is required that the thickness of the conductive sheath 17 is not less than the skin depth, the conductive sheath 17 is thicker than 6.4 μm the skin depth, and the thickness of the skin depth to the silver of the electromagnetic waves of 100 MHz is about 7 μm preferably.

Figure 5:
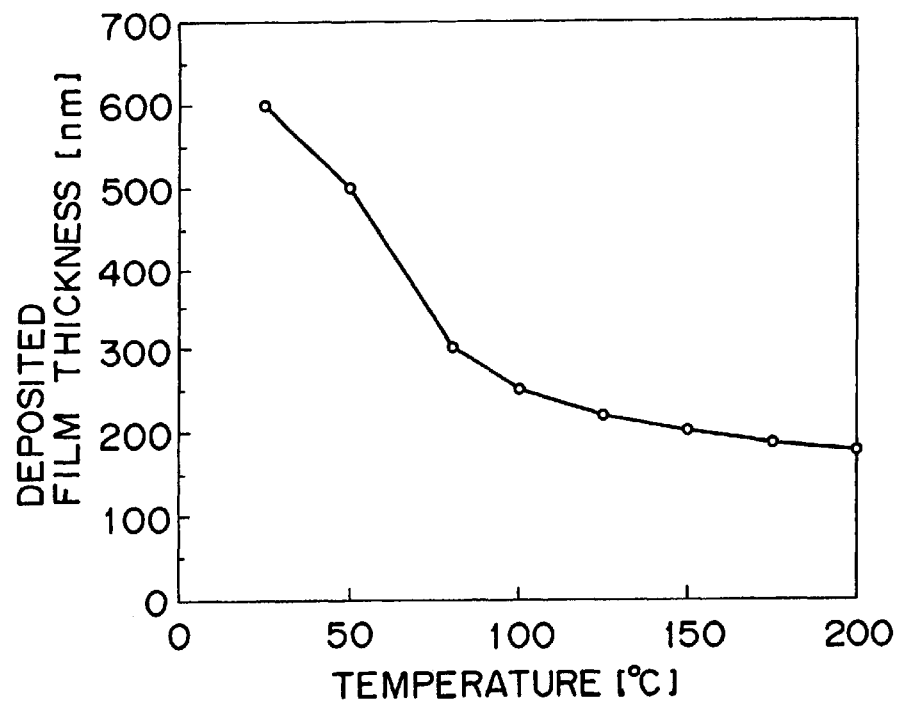
FIG. 5 is a graph showing measured results of a thickness of a film deposited on a dielectric body in the first embodiment of the present invention.

As one example, the substrate 7 with a silicon oxide film is etched for five minutes while the temperature of the dielectric body 9 is changed from 25 to 200° C. under the conditions that the kind and a flow rate of the gas, pressure, high frequency powers supplied to the spiral antenna 5 and electrode 6 are $C_4F_8/H_2$=50/15 sccm, 10 mTorr, 1000W, and 300W respectively. FIG. 5 shows measured results of thicknesses of deposited films deposited on the dielectric bodies 9 in the above case. It is shown in FIG. 5 that the thickness of the thin film deposited on the dielectric body 9 is smaller as the temperature of the dielectric body 9 is higher, particularly, the film thickness is reduced when the set temperature is 80° C. or higher. When many substrates 7 with silicon oxide films are etched under the same conditions as the above etching condition, the temperature of the dielectric body 9 is gradually increased in accordance with an increasing number of processings unless the resistance-heating heater 11 is present. In contrast, if the resistance-heating heater 11 is provided and the set temperature is not lower than 80° C., the temperature of the dielectric body 9 has good stability, changing within the set temperature plus or minus 15° C., even through a repeated number of processings. In the case without the heater 11, lot of dust starts to fall onto the substrates 7 approximately after 15 substrates are processed. However, when the dielectric body 9 is set at not lower than 80° C. with the resistance-heating heater 11, little dust falls on the substrates 7 even after 100 substrates are processed. An etching speed reproducibility is ±8% when the resistance-heating heater 11 is not installed and 15 substrates are continuously processed. on the other hand, when the resistance-heating heater 11 is provided and the dielectric body 9 is set at 80° C., the etching speed reproducibility is ±2%. The etching speed reproducibility is calculated according to an expression:

{[(maximum value of etching speed)−(minimum value of etching speed)]/(average value of etching speed)}×50.

In the case of plasma processing for silicon oxide film etching or silicon nitride film etching, the dielectric plate is heated to 150° C. or more, and this provides, in addition to the above mentioned advantage, a further advantage that the adsorption rate of CF-based radicals, such as CF and $CF_2$, on the dielectric plate is noticeably decreased so that the deposition of CF-based polymers on a substrate polysilicon is enhanced, resulting in improved select ratio of silicon oxide film or silicon nitride film/polysilicon for etching.

The absorption of electromagnetic waves by the resistance-heating heater 11 is checked. Such a large heat loss at the resistance-heating heater 11 as is caused when the electromagnetic waves are absorbed at the heat generating body 18 of the heater 11 and consequently, the heat generating body 18 is rapidly raised in temperature due to induction heating, or the plasma density is decreased remarkably as compared with the case without the heater 11 installed in the apparatus. The reason is that the heat generating body 18 is completely shielded from the electromagnetic waves by the conductive sheath (silver plating) 17 of the heater 11.

In comparison with the case where the dielectric body 9 is not heated, when the dielectric body 9 is heated to 80° C. or higher, the thin film deposited on the dielectric body 9 is remarkably reduced in thickness. Moreover, in comparison with the case where the dielectric body 9 is low in temperature, the film becomes finer in quality. Thus, the generation of dust is retarded and the maintenance frequency for the dielectric body 9 is remarkably low. The thickness change of the deposited film is small even when the processing is repeatedly carried out. Since the dielectric body 9 is maintained at the high temperature, the absorption rate of radicals remains low, not changing greatly. Accordingly, the ambience in the vacuum chamber 1, i.e., partial pressure of reaction species is stable and thus, plasma processing with excellent reproducibility can be achieved.

When the relation of Sy×0.6>Sh wherein Sy is the total area of one face of the dielectric body 9 and Sh is the area of the one face of the dielectric body 9 which is shielded by the resistance-heating heater 11 not to pass the electromagnetic waves is held, the electromagnetic waves radiated from the spiral antenna 5 are allowed to sufficiently to pass through the vacuum chamber 1, and therefore discharging is maintained easily. The inventors found that, unless the above relation is held, the discharging becomes unstable or high frequency reflecting power is sometimes brought about, or the discharging itself cannot be maintained in the worst case.

As a result of the pressure-weld type thermocouple 10 at the side face of the dielectric body 9, the temperature of the dielectric body 9 can be adjusted while monitored, with influences of high frequency noises being eliminated. Accordingly, temperature adjustments to the dielectric body 9 can be made in a manner to prevent malfunctions. Since the pressure-weld type thermocouple 10 has superior temperature response characteristics, the temperature can be adjusted correctly.

Figure 25:
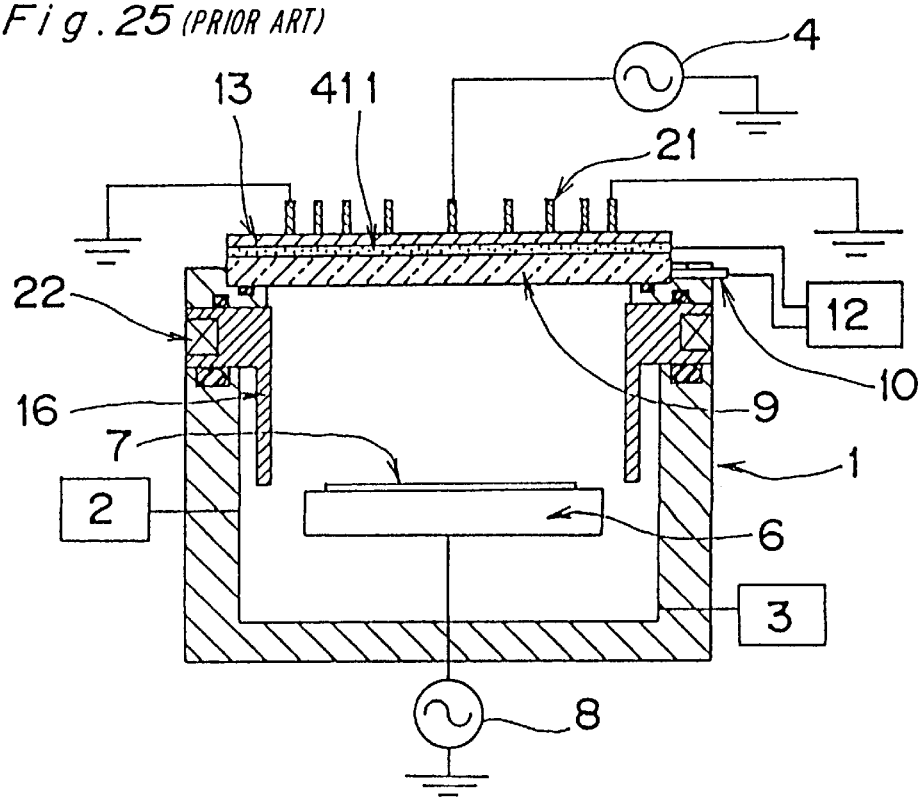
FIG. 25 is a sectional view showing the constitution of a plasma processing apparatus employed in the conventional example.

The case where the high frequency power supplied to the spiral antenna is 100 MHz is described above in the first embodiment of the present invention described above. However, the frequency is not limited to this and particularly the plasma processing method and apparatus of the present invention are effective in a frequency range of 30 MHz–3 GHz. Also the antenna is not limited to the spiral antenna, and the present invention is applicable to plasma processing methods and apparatuses with other antennas such as a spoke antenna of FIG. 25.

Figure 6:
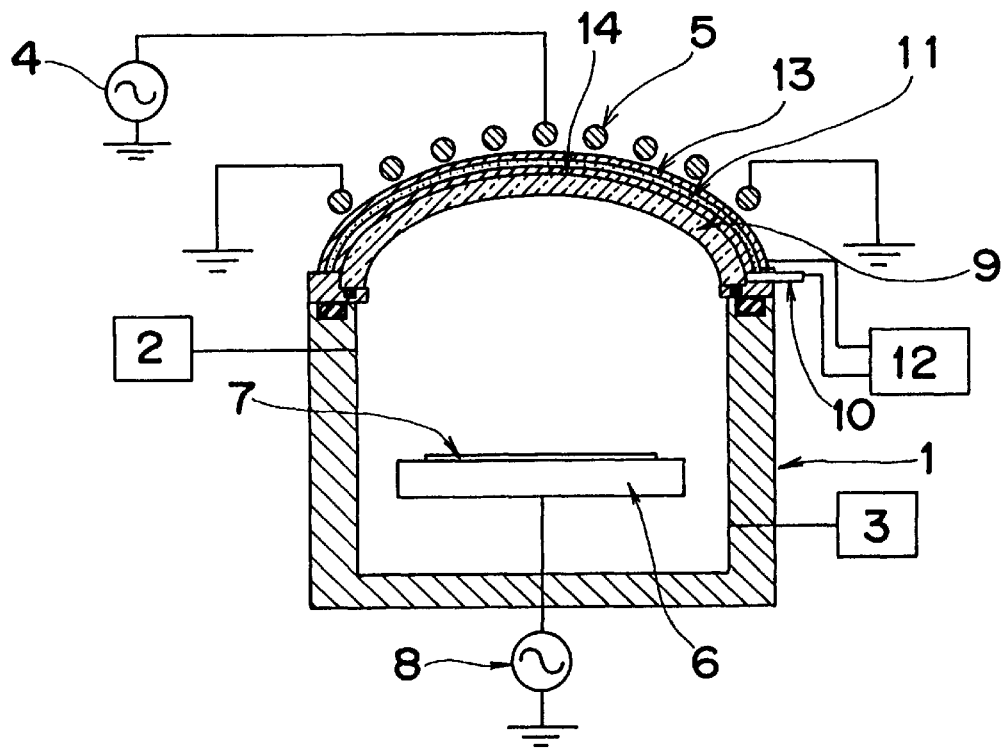
FIG. 6 is a sectional view showing a constitution of a plasma processing apparatus in a second embodiment of the present invention.

There is described in the first embodiment described hereinabove, the example where the flat dielectric body and the flat resistance-heating heater are employed. Shapes of the dielectric body and the resistance-heating heater are not restricted to flat. The present invention is applicable with various shapes, such as using a dome-like dielectric body 9, and a dome-like resistance-heating heater 11 as shown in FIG. 6, etc. The heater is directly embedded in the vacuum chamber 1 in the second embodiment of FIG. 6 without using an inner chamber, and is so constructed that almost any part in touch with the plasma can be heated along with the dielectric body 9.

There are described in the first and second embodiments the examples where $C_4F_8$ and $H_2$ are used to etch the silicon oxide film. The present invention is naturally applicable to etching of aluminum alloy, polysilicon, polycide, platinum, or ferroelectric bodies, or etc., or deposition (CVD) of silicon oxide films, or silicon nitride films, or the like. In particular, in the case where the gas is halogenated hydrogen gas, or halogenated boron gas, or carbon fluoride gas such as $CF_4$, $C_4F_8$ or the like, or gas containing hydrogen, carbon, fluorine such as $CHF_3$, $CH_2F_2$, or the like, the thin film of polymer or the like is undesirably deposited at high speed on the dielectric body unless the resistance-heating heater is employed. However, the deposition speed of this thin film onto the dielectric body is remarkably reduced with the use of the present invention. Also, even when the plasma processing is an etching process where an organic thin film is used as a mask, the speed for a reaction product including carbon produced from the mask material to be deposited on the dielectric body can be remarkably reduced during etching.

According to the above-described first and second embodiments, there is described the example where silver is used as the conductive sheath. If a resistivity of a conductor constituting the conductive sheath is not larger than $3 \times 10^{-8} \Omega \cdot m$, such phenomenon can prevent the electromagnetic waves from being absorbed by the heat generating body of the resistance-heating heater, thereby rapidly raising the temperature of the heat generating body because of induction heating, or remarkably decreasing the plasma density decreased in comparison with the case where the resistance-heating heater is absent, in other words, a large heat loss at the heater is generated. If a metal of a small resistivity, for example, gold or silver and easy to plate is coated by plating to a stainless sheath of a commercially available sheath heater as the conductive sheath, the resistance-heating heater is obtained inexpensively. In place of coating a metal of $3 \times 10^{-8} \Omega \cdot m$ or smaller resistivity to a surface of the sheath formed of a metal having a relatively high resistivity, e.g., stainless steal or the like as in the commercially available sheath heater, a heater with a sheath of an inexpensive metal such as copper or aluminum with a small resistivity can be manufactured to serve as the inexpensive resistance-heating heater.

Figure 7:
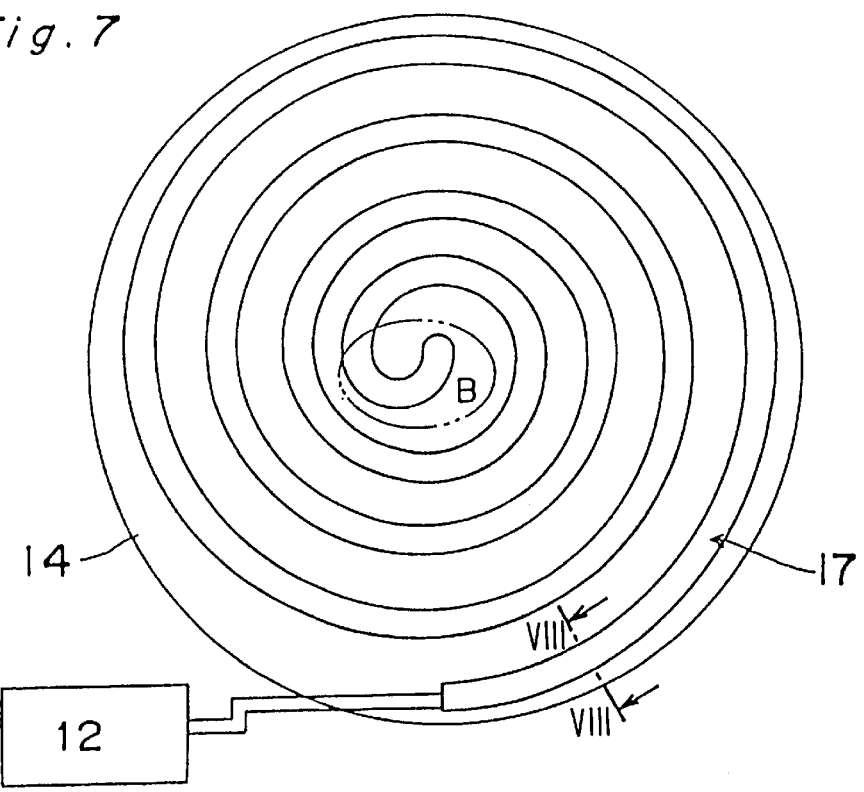
FIG. 7 is a plan view showing a spiral conductive sheath on an insulating member according to a modification of the embodiment.
Figure 8:
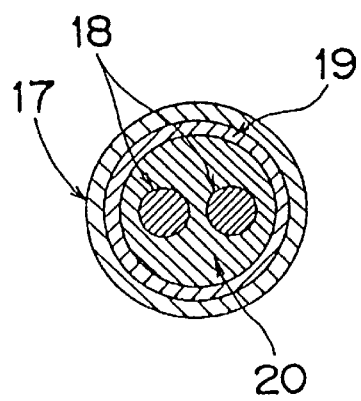
FIG. 8 is a sectional view taken along an VIII—VIII line of FIG. 7.
Figure 9:
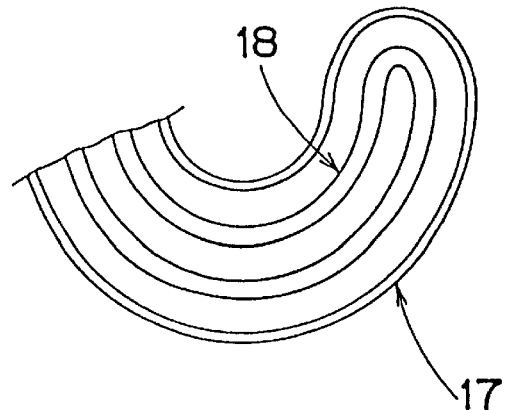
FIG. 9 is an enlarged perspective view of an inner end portion of a heating element arranged at a region indicated by B in a central part of a dielectric body in FIG. 7.
Figure 10:
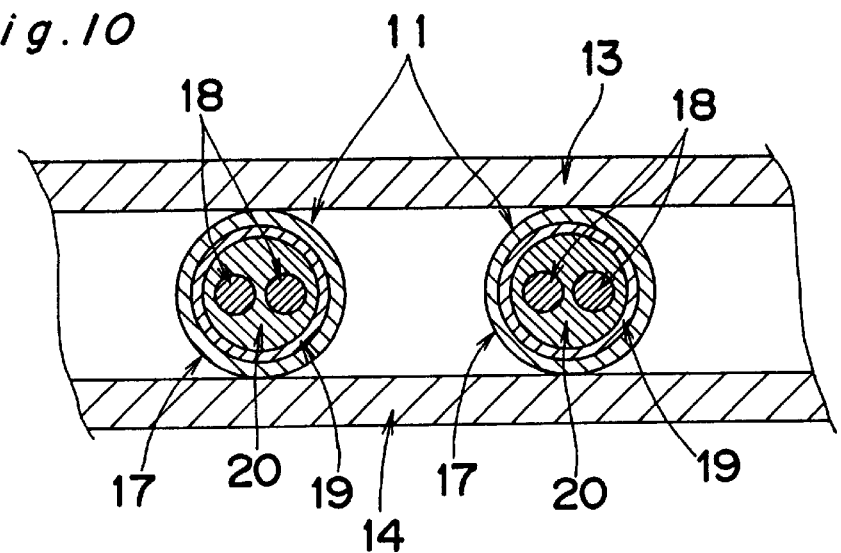
FIG. 10 is an enlarged sectional view of the constitution of the resistance heating heater used in the modification of FIG. 7.

As a modification of the embodiment, FIG. 7 shows a case where the heating element 18 shielded from the electromagnetic waves by the conductive sheath 17 is arranged as an spiral, and the heating element 18 is arranged even at the central part of the dielectric body 9. FIG. 8 is a sectional view taken along an VIII—VIII line of FIG. 7 and shows a state where two heating elements 18 are arranged in an insulating material 20 of the conductive sheath 17. FIG. 9 shows an enlarged perspective view of an inner end portion of the conductive sheath 17 in a region indicated by B at the central portion of the dielectric body 9, wherein the heating element 18 is bent and folded back in a U-shape in the inner end portion of the conductive sheath 17. FIG. 10 is a sectional view of the constitution of the resistance heating heater used in this modification.

Figure 11:
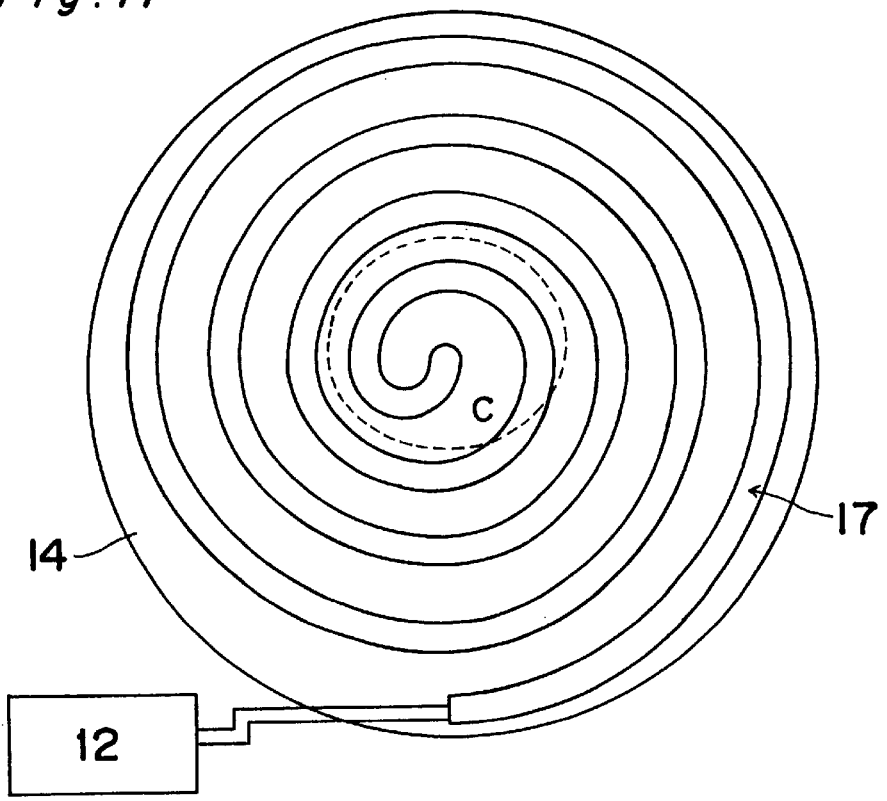
FIG. 11 is a plan view showing a spiral conductive sheath on an insulating member according to another modification of the embodiment.
Figure 12:
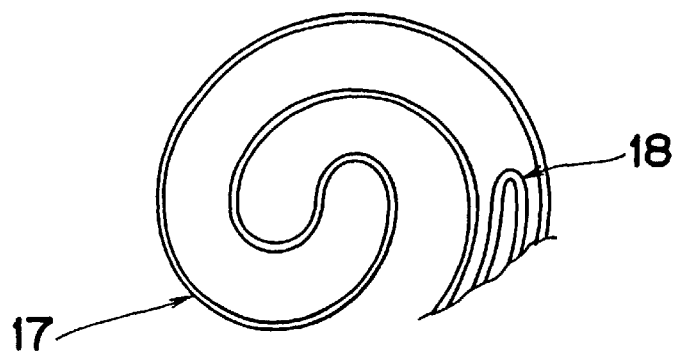
FIG. 12 is an enlarged perspective view of an inner end portion of a heating element arranged at a region indicated by C in a central part of a dielectric body in FIG. 11.

As another modification of the embodiment, FIG. 11 shows a case where the heating element 18, shielded from the electromagnetic waves by the conductive sheath 17, is arranged in a spiral, and the conductive sheath 17 is arranged even at the central part of the dielectric body 9, and the heating element 18 is arranged over almost all of a surface of the dielectric body 9 except in the vicinity of the inner end portion of the conductive sheath 17 at the central part of the dielectric body 9. FIG. 12 is an enlarged perspective view of the inner end portion of the conductive sheath 17 at a region indicated by C in the central part of the dielectric body 9 in FIG. 11. The heating element 18 is not arranged at the end of the conductive sheath 17, and there is no heating element at the end portion of the conductive sheath 17, and only the conductive sheath 17 is located at the end.

According to the two modifications, the substrate is processed in the plasma produced in a state where the dielectric plate is heated by the heater generating heat except at the central part and the electrostatic coupling between the coil and the plasma is weakened by the Faraday shield at the central part. Thus, the dielectric plate can be uniformly and thermally heated and prevented from being sputtered in the vicinity of the center of the dielectric plate.

Figure 13:
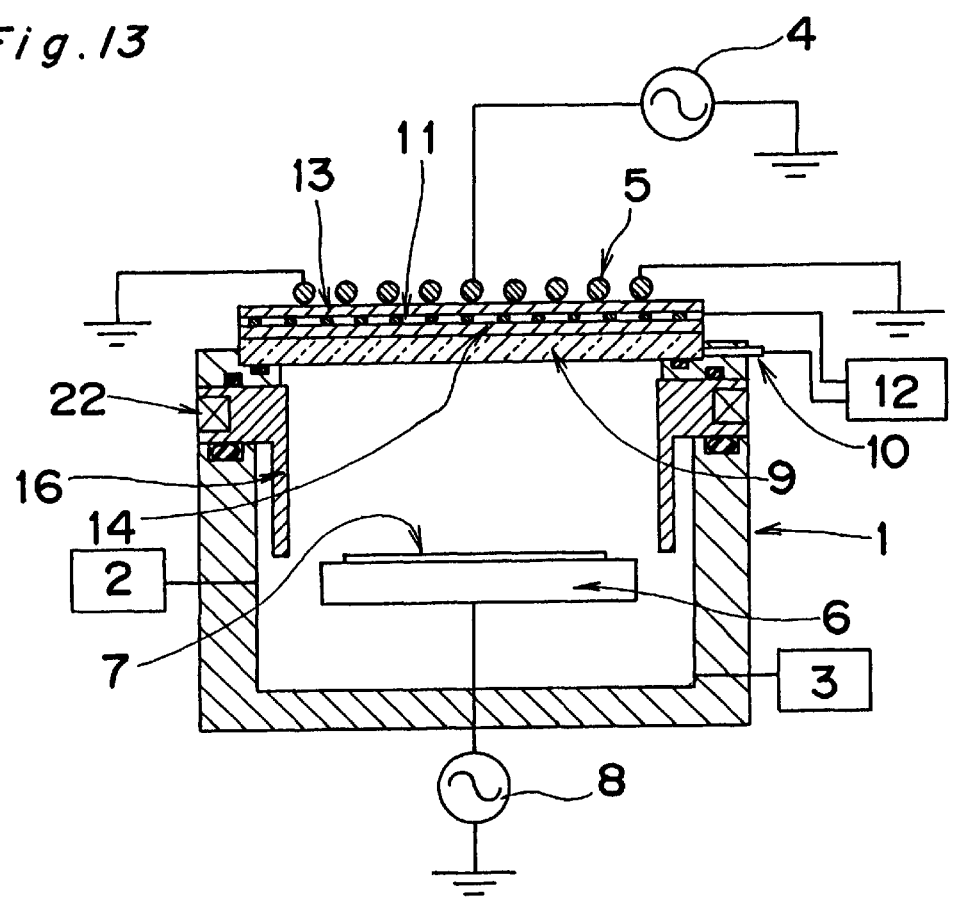
FIG. 13 is a sectional view showing a construction of a plasma processing apparatus for etching according to a third embodiment of the present invention which comprises a spiral conductive sheath according to the modification of FIG. 7.

Furthermore, FIG. 13 is a sectional view showing the construction of a plasma processing apparatus for the etching process according to any one of the third through fifth embodiments of the present invention which comprises the spiral conductive sheath according to the modification of FIG. 7. The plasma processing apparatus will be described in detail in the third embodiment described below.

Before the description of apparatus constructions of the third through fifth embodiments, first, conventional issues specific to the third embodiment will be described below. In the conventional method represented in FIGS. 18–21, the heat generating body is installed nearly uniformly over almost all of the surface except the central part of the dielectric plate, and therefore, the effect of the Faraday shield cannot be expected at the central part of the dielectric plate. Because of this, the central part of the dielectric plate is practically sputtered at the vacuum side, shortening the life of the dielectric plate, and the substance composing the dielectric plate contaminates the substrate.

If the heat generating body was uniformly disposed over nearly the whole surface of the dielectric plate, including the central part, in order to avoid the above-described issues, a temperature of the central part of the dielectric plate would be higher than the other parts, which disadvantageously damages heating uniformity.

A method and an apparatus for plasma processing of the third through fifth embodiments of the present invention is devised to solve these issues, and provides a method and an apparatus for plasma processing whereby a dielectric plate is heated with good thermal uniformity and prevented from being sputtered at a central part thereof.

A method and an apparatus for plasma processing according to the third through fifth embodiments of the present invention will be described below. Since the apparatus except the heat generating body 110, is the same structurally as the conventional one shown in FIGS. 19 and 20, the description on the structure will be omitted.

The third embodiment of the present invention will be described with reference to FIG. 14.

Figure 14:
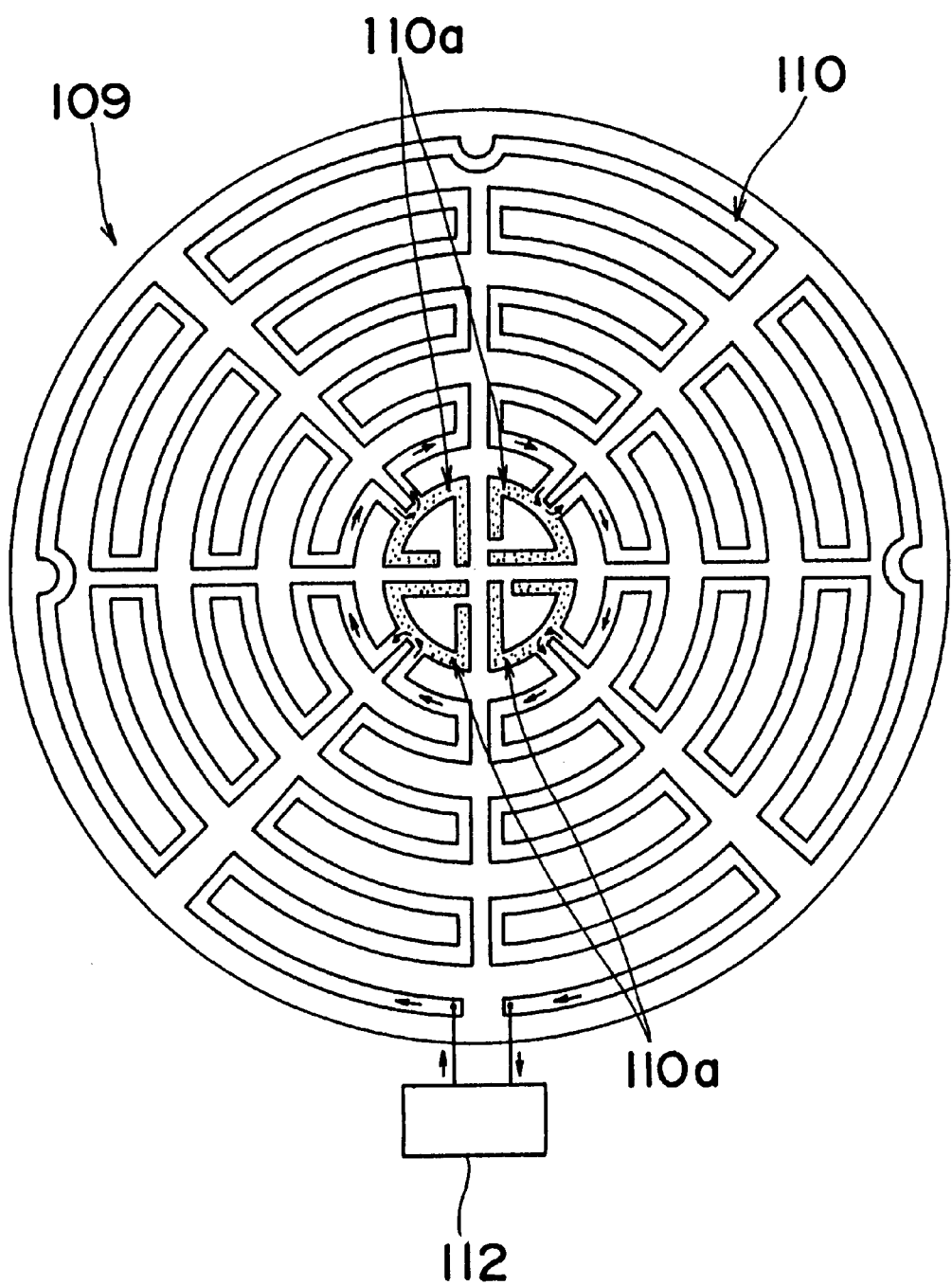
FIG. 14 is a plan view of a heat generating body constituting a resistance-heating heater used in a third embodiment of the present invention.

FIG. 14 is a plan view of a heat generating body 110 (which corresponds to the heating element 18 in the first and second embodiments, and does so similarly in the fourth and fifth embodiments) constituting a resistance-heating heater 109 (which corresponds to the resistance-heating heater 11 in the first and second embodiments, and does so similarly in the fourth and fifth embodiments) used in a plasma processing apparatus according to the first embodiment. As in FIG. 14, the heat generating body 110 is installed nearly uniformly and nearly over all of a face including a central part, of a dielectric plate 105, and a current from a heater power source 112 is adapted not to run to a central part 110a of the heat generating body 110 arranged in the vicinity of the center of the dielectric plate 105. More specifically, although the current flows to the heat generating body 110 as indicated by an arrow in the drawing, the current does not flow to the central part 110a because an end of the central part 110a of the heat generating body 110 in the vicinity of the center of the dielectric plate 105 is opened. Therefore, the central part 110a of the heat generating body 110 does not generate heat in the vicinity of the center of the dielectric plate 105. Here, the central part 110a of the heat generating body 110 is a part where no heat is produced and thermal uniformity is maintained even with a smaller amount of heat generated than at the other parts (e.g., a circumferential part surrounding the central part). In other words, the central part 110a functions to prevent the heat generating body 110 from generating heat at the central part so as to avoid an extreme temperature rise at the central part, thereby to enhance thermal uniformity of the dielectric plate 105.

By way of example, when the central part 110a of the heat generating body 110 has 5% of the total area of the dielectric body 105 (total area of a surface of the circular, rectangular or the like dielectric body 105 faced to the heat generating body 110) of quartz with a 350 mm diameter and a 25 mm thickness, the dielectric body 105 shows 210° C. at a part corresponding to the central part 110a of the heat generating body 110 and 200° C. at an outer circumferential end part thereof. When the central part 110a of the heat generating body 110 has 10% the total area of the dielectric body 105, the part of the dielectric body 105 corresponding to the central part 110a is 200° C. and, the outer circumferential end part of the dielectric body 105 becomes 200° C. If the central part 110a of the heat generating body 110 occupies 20% of the total area of the dielectric body 105, the part of the dielectric body corresponding to the central part 110a is 190° C. and the outer circumferential end part thereof is 200° C. From this, as one example, it is preferable that 5–20% of the total area of the dielectric body 105 is allotted to the central part 110a of the heat generating body 110.

Further, in using the heat generating body 110 shown in FIG. 14, the central part 110a of the heat generating body 110 acts as a Faraday shield in the vicinity of the center of the dielectric body 105, thereby weakening the electrostatic coupling of the coil 106 and the plasma. Accordingly, the dielectric plate 105 can be prevented from having a large-negative charge at the vacuum side and from being sputtered due to the collision of positive ions in the plasma at high speed with the dielectric plate 105.

In the third embodiment, the central part 110a of the heat generating body 110 may be closed, not partly opened, and the heater at the central part 110a may be made sufficiently larger in breadth than at the other parts to decrease the resistance, although it is not specifically illustrated. This arrangement achieves substantially the same effect as when the central part 110a is open.

A fourth embodiment of the present invention will be discussed with reference to FIG. 15.

Figure 15:
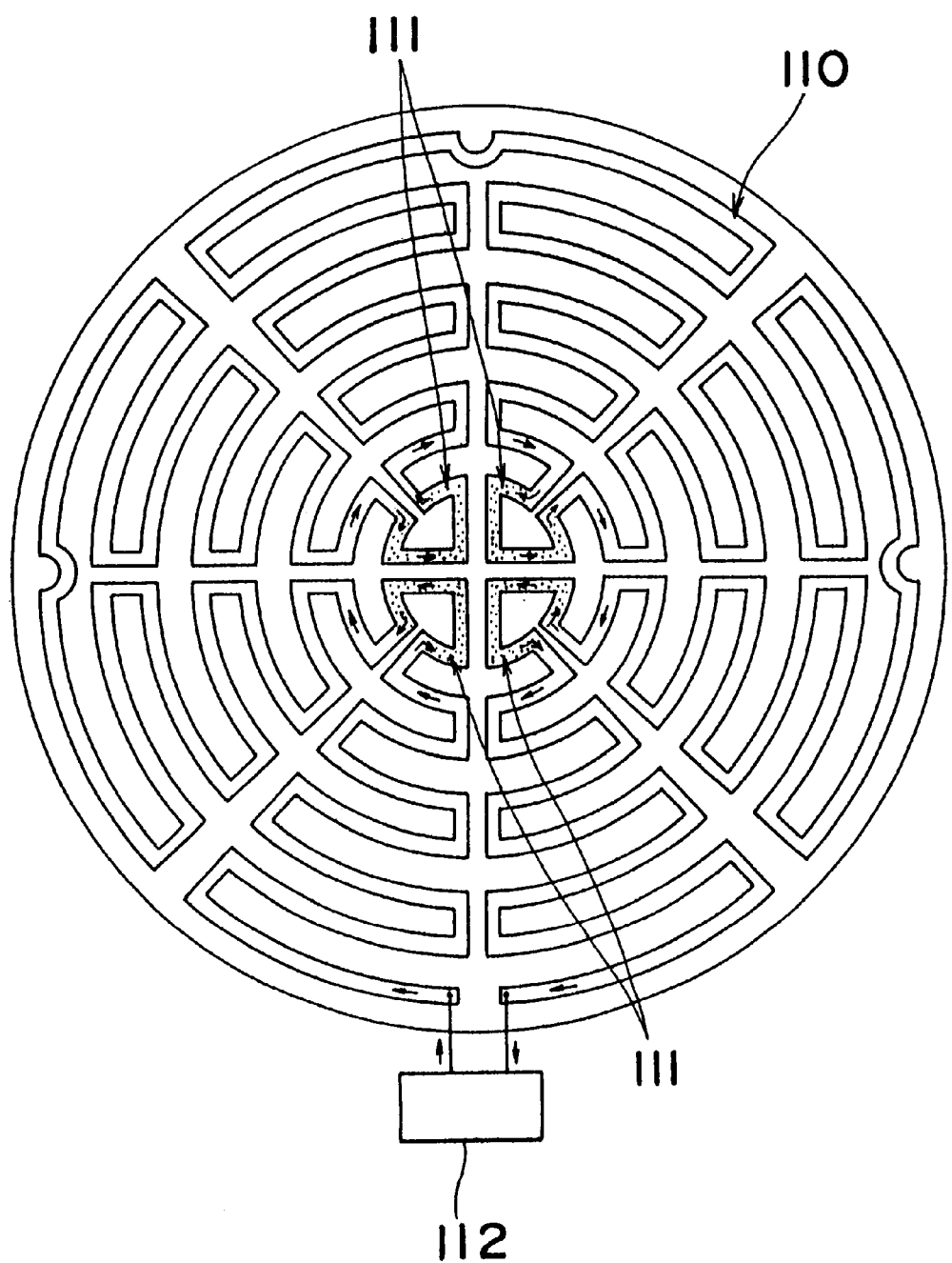
FIG. 15 is a plan view of a heat generating body and a low resistance conductor constituting a resistance-heating heater used in a fourth embodiment of the present invention.

In FIG. 15 is shown a plan view of the heat generating body 110 and a low resistance conductor 111 constituting the resistance-heating heater 109 employed in a plasma apparatus according to the fourth embodiment. As is shown in FIG. 15, in place of the opened central part 110a in the third embodiment, the heat generating body 110 has the low resistance conductor 111, for example, formed of copper at a position corresponding to the central part 110a. The low resistance conductor 111 has a lower resistance than the heat generating body 110. The heat generating body 110 itself is installed almost uniformly and nearly over all of the surface of the dielectric plate 105 except for the vicinity of the center of the dielectric plate 105, and at the same time, the heat generating body 110 is connected to the low resistance conductor 111 located in the vicinity of the center of the dielectric plate 5. While the current from the heater power source 112 runs as indicated by arrows in FIG. 15, since the low resistance conductor 111 is set in the vicinity of the center of the dielectric plate 105, the low resistance conductor 111 does not generate heat in the vicinity of the center of the dielectric plate 105. The resistance of the low resistance conductor 111 is preferably so low as to never generate heat, even when the current flows to the heat generating body 110 for heat generation or generates merely a negligible level of heat as compared with the heat generated at the heat generating body 110. For example, the resistance of the low resistance conductor is preferably not larger than 70% of the resistance of the heat generating body.

For confirming that the dielectric plate 105 is uniformly heated in the plasma processing apparatus in the above configuration the dielectric plate is measured and detected to be heated superiorly uniformly, i.e., at 200±5° C.

Because of the employment of the heat generating body 110 and the low resistance conductor 111 of FIG. 15, the low resistance conductor 111 works as the Faraday shield also in the vicinity of the center of the dielectric plate 105 and lessens the electrostatic coupling between the coil 106 and the plasma, whereby the dielectric plate 105 can be prevented from having a large negative charge at the vacuum side thereof and prevented from being sputtered by the high-speed collision of positive ions in the plasma to the dielectric plate 105.

Figure 19:
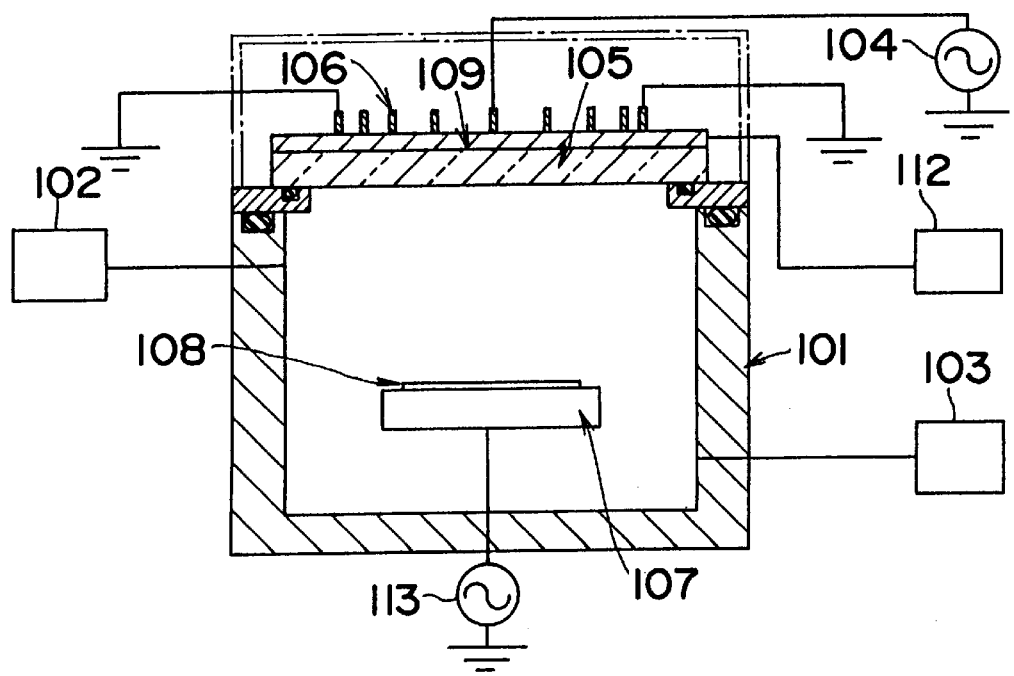
FIG. 19 is a sectional view showing a constitution of a plasma processing apparatus used in the embodiments of the present invention and in a conventional example.
Figure 20:
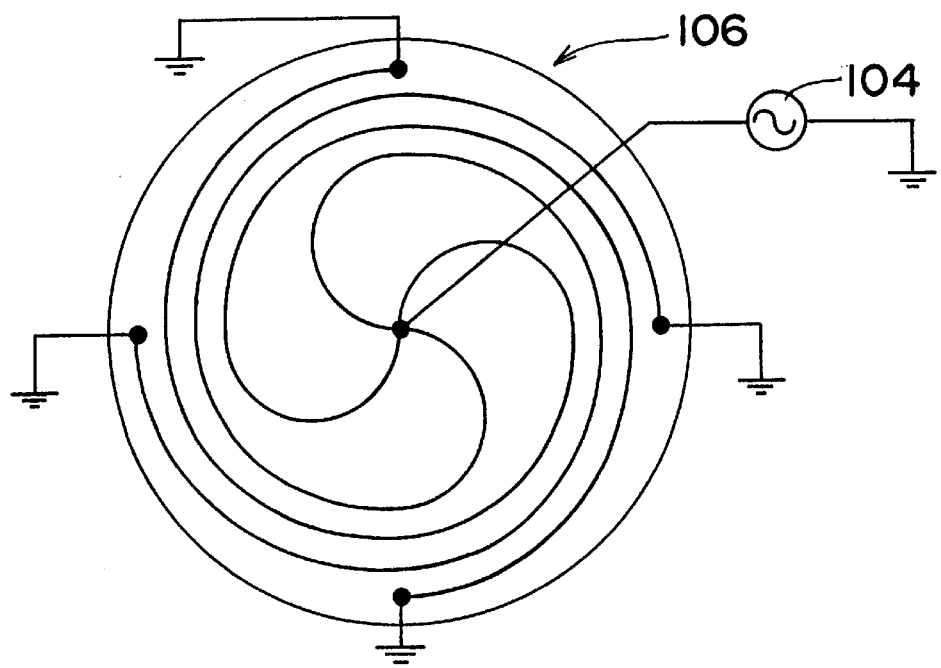
FIG. 20 is a plan view of a coil used in the embodiments of a present invention and in the conventional example.
Figure 21:
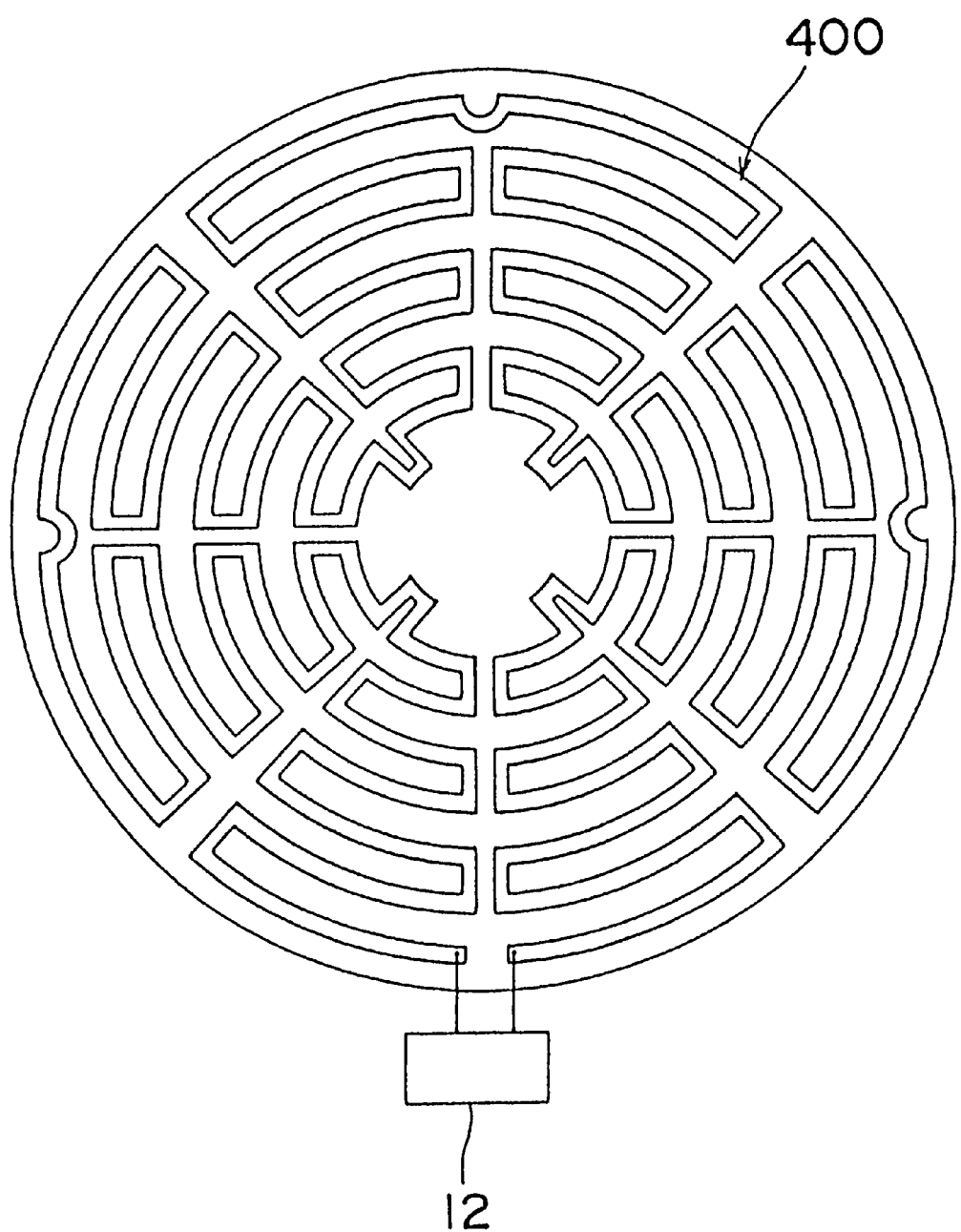
FIG. 21 is a plan view of a heat generating body constituting a resistance-heating heater used in conventional example.
Figure 22:
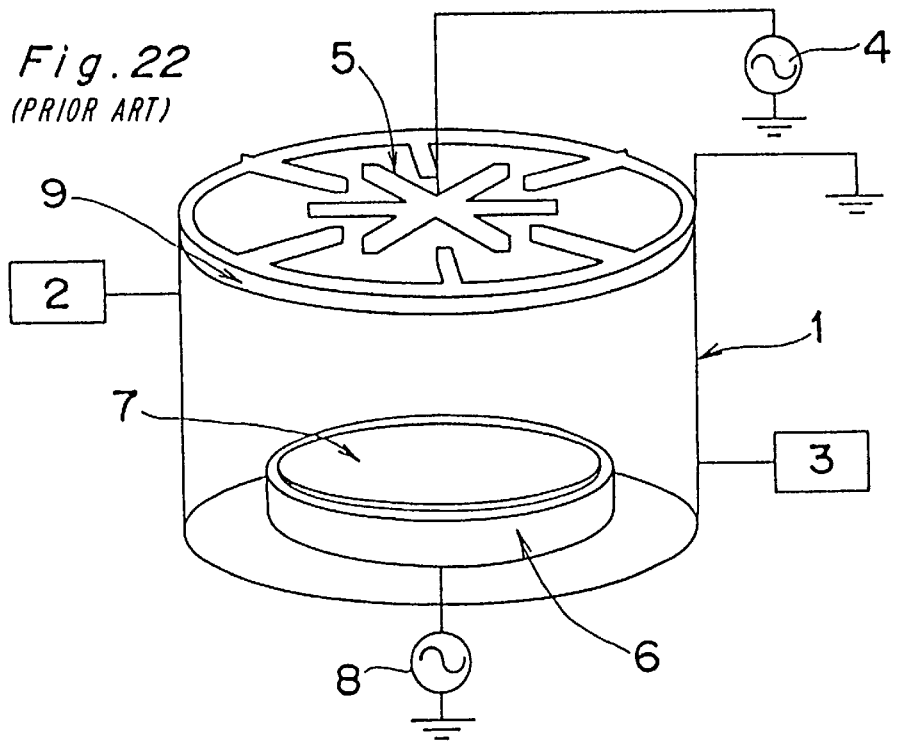
FIG. 22 is a perspective view schematically showing a constitution of a plasma processing apparatus in a conventional example.
Figure 23:
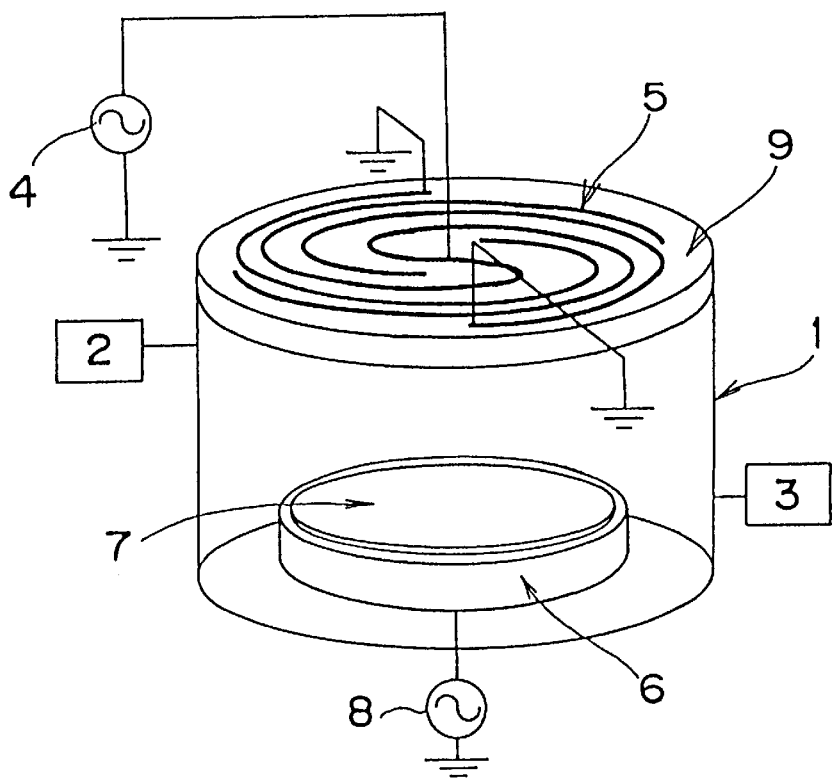
FIG. 23 is a perspective view schematically showing a constitution of a plasma processing apparatus in a conventional example.
Figure 24:
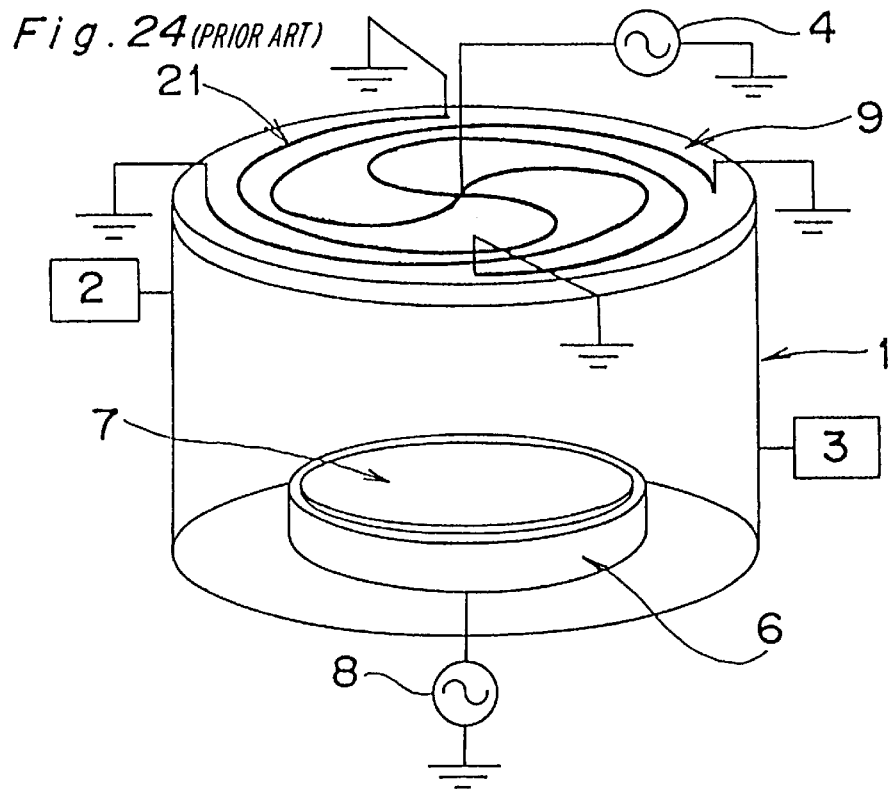
FIG. 24 is a perspective view showing a constitution of a plasma processing apparatus employed in a conventional example.

A fifth embodiment of the present invention will be described with reference to FIGS. 16, 19, and 20.

Figure 16:
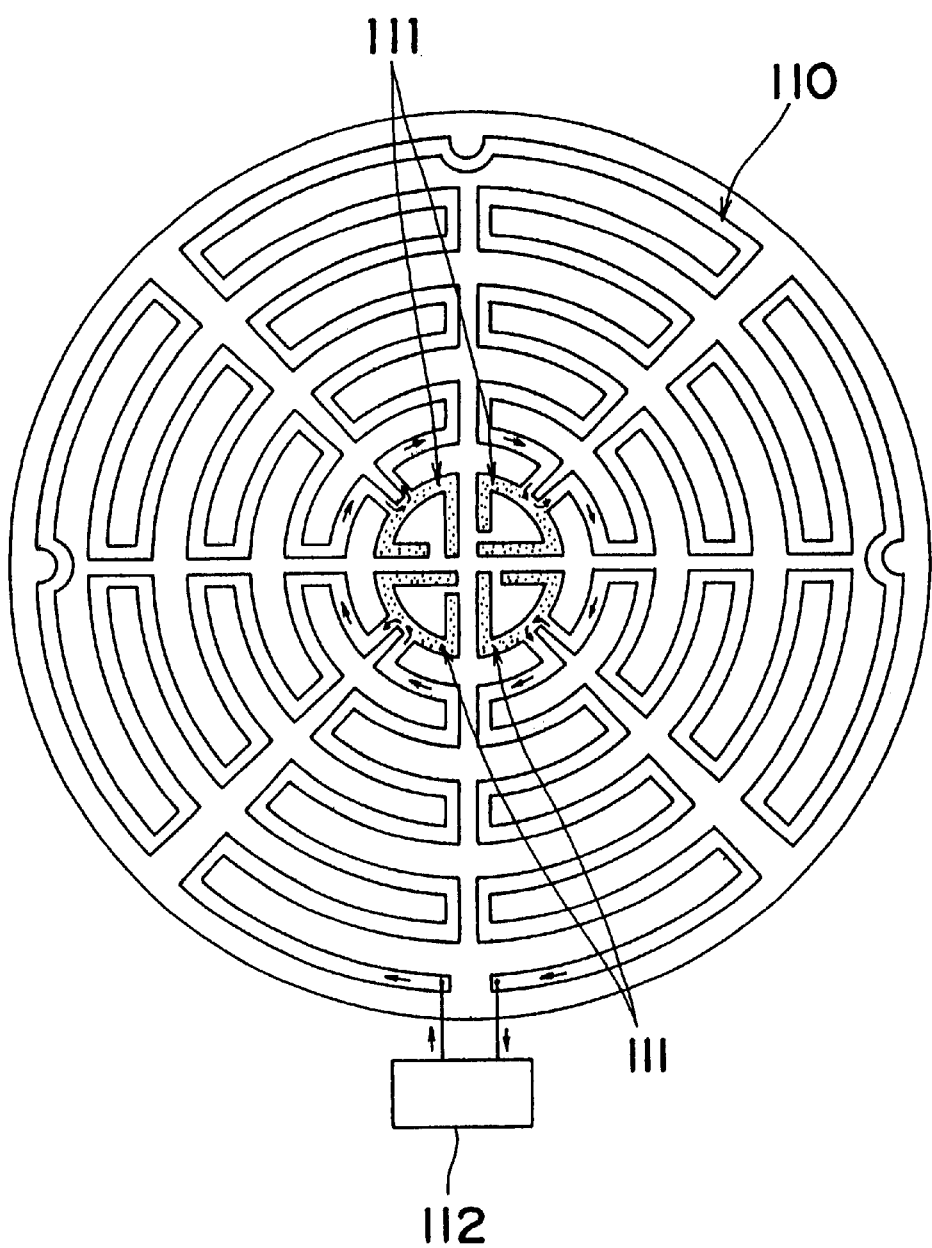
FIG. 16 is a plan view of a heat generating body and a low resistance conductor constituting a resistance-heating heater used in a fifth embodiment of the present invention.

FIG. 16 indicates a plan view of the heat generating body 110 and low resistance conductor 111 constituting the resistance-heating heater 109 used in a plasma processing apparatus according to the fifth embodiment of the present invention. As is shown in FIG. 16, the heat generating body 110 has a low resistance conductor 111 at a position corresponding to the low resistance conductor 111 of the fourth embodiment. The low resistance conductor 111 of the fifth embodiment has a lower resistance than that of the heat generating body 110 and is opened at its end. The heat generating body 110 itself is almost uniformly installed over almost all of the surface except for the central part of the dielectric plate 105. The current from the heater power source 112 is arranged not to flow to the low resistance conductor 111 in the vicinity of the center of the dielectric plate 105. That is, while the current flows to the heat generating body 110 as indicated by arrows in the figure, the current does not run to the low resistance conductor 111 in the vicinity of the center of the dielectric plate 105 because the end of the conductor 111 is open. Accordingly, the low resistance conductor 111 does not generate heat in the vicinity of the center of the dielectric plate 105.

In order to confirm that the dielectric plate 105 is uniformly heated in the above-configured plasma processing apparatus, the dielectric plate is measured. The results is that the dielectric plate 105 is heated with excellent thermal uniformity, i.e., at 200±5° C.

Moreover, owing to the use of the heat generating body 110 and low resistance conductor 111 of FIG. 16, the low resistance conductor 111 serves as the Faraday shield in the vicinity of the center of the dielectric body 105, and weakens the electrostatic coupling between the coil 106 and plasma. Accordingly, the dielectric plate 105 can be prevented from having a large negative charge at the vacuum side and also prevented from being sputtered because of the high-speed collision of positive ions in the plasma to the dielectric plate 105.

Figure 17:
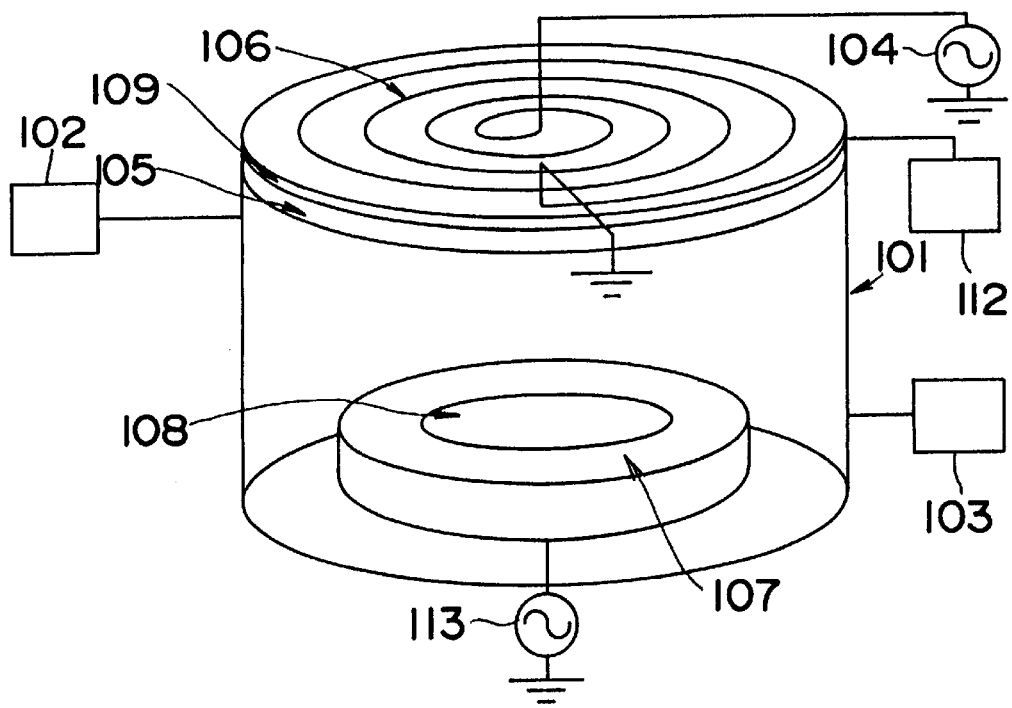
FIG. 17 is a diagram showing a constitution of a plasma processing apparatus used in a different embodiment of the present invention.
Figure 18:
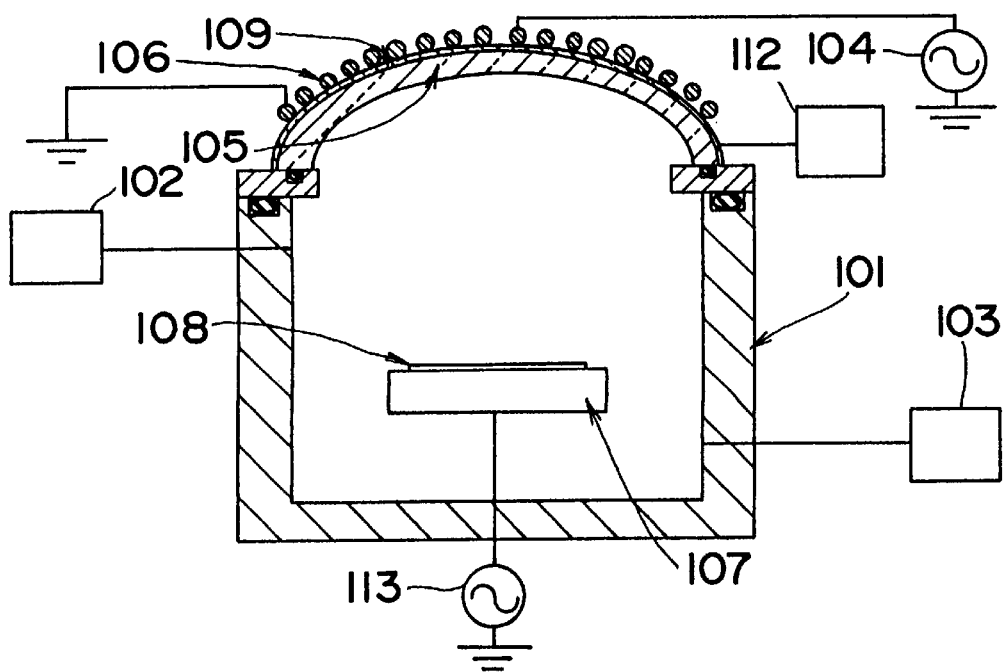
FIG. 18 is a diagram showing a constitution of a plasma processing apparatus used in a still different embodiment of the present invention.

In the third through fifth embodiments of the present invention described hereinabove, the flat coil 106 of multi-spirals is placed along the dielectric plate 105 constituting an outer wall face of the vacuum chamber 101. However, a shape of the coil 106 and a positional relation of the vacuum chamber 101, dielectric plate 105, and coil 106 are not restricted to the above. The present invention is applicable to various models of high frequency induction type plasma processing methods and apparatuses as well as other embodiments represented in FIGS. 17 and 18. That is, the coil 106 in FIG. 17 is not a multi-spiral one, but a single flat spiral. The coil 106 in FIG. 18 is constructed three-dimensionally, not flat, like a temple bell. A curvature of the bell-like coil 106 of FIG. 18 is preferably such that a height of a central part becomes approximately 20–30% of an outer diameter of the whole coil 106.

As is made clear from the foregoing description, in the plasma processing method according to the third and fifth embodiments of the present invention, the vacuum chamber 101 is evacuated while the gas is supplied to the vacuum chamber 101, thereby to control the vacuum chamber 101 at the predetermined pressure. In this state, the high frequency power is supplied to the coil 106 disposed along the dielectric plate 105 to generate the plasma in the vacuum chamber 101. The substrate 108 placed on the electrode 107 in the vacuum chamber 101 is thus processed using the method. In the method, the dielectric plate 105 is heated by the heater 110 which generates heat except at the central part thereof, and at the same time, the electrostatic coupling between the coil 106 and the plasma is weakened because of the Faraday shield at the central part. Since the substrate 108 is processed while generating the plasma in the above state, the dielectric plate 105 can be heated with good thermal uniformity and prevented from being sputtered in the vicinity of the center thereof.

The plasma processing apparatus in the third through fifth embodiments includes the device 102 for supplying the gas into the vacuum chamber 101, the device 103 for evacuating the vacuum chamber 101, the electrode 107 for setting the substrate 108 in the vacuum chamber 101, the coil 106 for generating the plasma in the vacuum chamber 101, the dielectric plate 105 where the coil 106 is disposed, the device 104 for supplying the high frequency power to the coil 106, the resistance-heating heater 109 for heating the dielectric plate 105, and the heater power source 112 for supplying the current to the resistance-heating heater 109. In the plasma processing apparatus, the heat generating body 110 of the resistance-heating heater 109 is almost uniformly arranged over nearly all of the surface of the dielectric plate 105 including the vicinity of the center of the dielectric plate 105. Moreover, the current from the heater power source 112 is adapted not to flow to the heat generating body 110 in the vicinity of the center of the dielectric plate 105. Therefore, the dielectric plate 105 can be heated with good thermal uniformity and prevented from being sputtered at the central part thereof.

The plasma processing apparatus according to the third and fifth embodiments includes the device 102 for supplying the gas into the vacuum chamber 101, the device 103 for evacuating the vacuum chamber 101, the electrode 107 for setting the substrate 108 in the vacuum chamber 101, the coil 106 for generating plasma in the vacuum chamber 101, the dielectric plate 105 where the coil 106 is disposed, the device 104 for supplying the high frequency power to the coil 106, the resistance-heating heater 109 for heating the dielectric plate 105, and the heater power source 112 for supplying the current to the resistance-heating heater 109. In the plasma processing apparatus, the heat generating body 110 of the resistance-heating heater 109 is almost uniformly arranged nearly all over the surface of the dielectric plate 105 except the vicinity of the center of the dielectric plate 105, and the low resistance conductor 111 located in the vicinity of the center of the dielectric plate 105 is connected to the heat generating body 110 of the resistance-heating heater 109. Accordingly, the dielectric plate 105 can be heated with good thermal uniformity and prevented from being sputtered in the vicinity of the center thereof.

When the coil 106 is partly or totally of a multi-spiral type, the inductance of the spiral coil becomes considerably small, so that the plasma processing apparatus can provide outstanding matching features.

The entire disclosure of Japanese Patent Applications No. 9-201272 filed on Jul. 28, 1997 and No. 9-62993 filed on Mar. 17, 1997, including specifications, claims, drawings, and summaries are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method, comprising:
   evacuating a vacuum chamber while supplying gas into the vacuum chamber, thereby controlling a pressure of the vacuum chamber at a predetermined pressure;
   supplying high frequency power to an antenna;
   radiating electromagnetic waves from the antenna into the vacuum chamber via a dielectric body;
   producing plasma in the vacuum chamber;
   heating the dielectric body to 80° C. or higher by feeding a current to a resistance-heating heater having a heat generating body shielded from the electromagnetic waves by a conductive sheath; and
   processing a substrate placed on an electrode in the vacuum chamber.

2. A plasma processing method according to claim 1, wherein the gas is halogenated hydrogen gas, halogenated boron gas, carbon fluoride gas, or a gas comprising hydrogen, carbon and fluorine.

3. A plasma processing method according to claim 2, wherein the carbon fluoride gas comprises $CF_4$ or $C_4F_8$.

4. A plasma processing method according to claim 2, wherein the gas comprising hydrogen, carbon and fluorine comprises $CHF_3$ or $CH_2F_2$.

5. A plasma processing method according to claim 1, wherein the high frequency power has a frequency range of 30 MHz–3 GHz.

6. A plasma processing method according to claim 1, wherein the following relation is satisfied:

$$Sy \times 0.6 > Sh$$

where Sy is a total area of one face of the dielectric body, and Sh is an area of a part of the one face of the dielectric body which is shielded from passing the electromagnetic waves by the resistance-heating heater.

7. A plasma processing method according to claim 1, wherein the conductive sheath has an electric resistivity of $3\times10^{-8}\Omega\cdot m$ or lower.

8. A plasma processing method according to claim 7, wherein the conductive sheath comprises gold, silver, copper or aluminum.

9. A plasma processing method according to claim 1, further comprising adjusting a temperature of the dielectric body with a pressure-weld type thermocouple that is fitted at a side face of the dielectric body, while monitoring the temperature.

10. A plasma processing method, comprising:
    evacuating a vacuum chamber while supplying a gas into the vacuum chamber, thereby controlling a pressure of the vacuum chamber at a predetermined pressure;
    supplying high frequency power to a coil arranged along a dielectric body;
    radiating electromagnetic waves from the coil into the vacuum chamber via the dielectric body;
    producing plasma in the vacuum chamber;
    heating the dielectric body to 80° C. or higher by feeding a current to a resistance-heating heater having a heat element shielded from the electromagnetic waves by a conductive sheath; and
    processing a substrate placed on an electrode in the vacuum chamber.

11. A plasma processing method according to claim 10, wherein said heating of the dielectric body comprises heating the dielectric body with a resistance-heating heater that generates heat except at a central part of the resistance-heating heater and wherein the central part of the resistance-heating heater weakens electrostatic coupling between the coil and the plasma by a Faraday shield.

12. A plasma processing method according to claim 11, further comprising supplying high frequency power to the electrode.

13. A plasma processing method according to claim 11, wherein said heating of the dielectric body further comprises preventing temperature rise as a result of a concentration of heat by the resistance-heating heater with the central part of the resistance heater and restricting heat generation so as to enhance thermal uniformity of the dielectric body with the central part of the resistance heater.

14. A plasma processing method according to claim 11, wherein the central part occupies 5–20% of a total area of the dielectric body.

15. A plasma processing method according to claim 10, wherein the gas is halogenated hydrogen gas, halogenated boron gas, carbon fluoride gas, or a gas comprising hydrogen, carbon and fluorine.

16. A plasma processing method according to claim 15, wherein the carbon fluoride gas comprises $CF_4$ or $C_4F_8$.

17. A plasma processing method according to claim 15, wherein the gas comprising hydrogen, carbon and fluorine comprises $CHF_3$ or $CH_2F_2$.

18. A plasma processing method according to claim 10, wherein the high frequency power has a frequency range of 30 MHz–3 GHz.

19. A plasma processing method according to claim 10, wherein the following relation is satisfied:

$$Sy \times 0.6 > Sh$$

where Sy is a total area of one face of the dielectric body, and Sh is an area of a part of the one face of the dielectric body which is shielded by the resistance-heating heater from passing the electromagnetic waves.

20. A plasma processing method according to claim 10, wherein the conductive sheath has an electric resistivity of $3\times10^{-8}\Omega\cdot m$ or lower.

21. A plasma processing method according to claim 10, further comprising adjusting a temperature of the dielectric body with a pressure-weld type thermocouple that is fitted at a side face of the dielectric body, while monitoring the temperature.

22. A plasma processing apparatus, comprising:
    a vacuum chamber;
    a gas feed unit operable to supply a gas into said vacuum chamber;
    a pump operable to evacuate said vacuum chamber;
    an antenna operable to generate electromagnetic waves;
    a high frequency power source operable to supply high frequency power to said antenna;
    an electrode located in said vacuum chamber for placement of a substrate;
    a dielectric body operable to introduce the electromagnetic waves generated from said antenna into said vacuum chamber;
    a resistance-heating heater having a heat generating body that is shielded from the electromagnetic waves by a conductive sheath, said resistance-heating heater being operable to heat said dielectric body; and
    a heater-use power source operable to supply a current to said resistance-heating heater.

23. A plasma processing apparatus claimed in claim 22, wherein said high frequency power source is capable of generating a frequency in a range of 30 MHz–3 GHz.

24. A plasma processing apparatus claimed in claim 22, wherein the following relation is satisfied:

$$Sy \times 0.6 > Sh$$

where Sy is a total area of one face of said dielectric body, and Sh is an area of a part of said one face of said dielectric body which is shielded by said resistance-heating heater from passing the electromagnetic waves.

25. A plasma processing apparatus claimed in claim 22, wherein said conductive sheath has an electric resistivity of $3\times10^{-8}\Omega\cdot m$ or lower.

26. A plasma processing apparatus claimed in claim 22, wherein said conductive sheath comprises gold, silver, copper or aluminum.

27. A plasma processing apparatus claimed in claim 22, further comprising a pressure-weld type thermocouple fitted at a side face of said dielectric body, said pressure-weld type thermocouple operable to adjust a temperature of said dielectric body while monitoring the temperature.

28. A plasma processing apparatus, comprising:
    a vacuum chamber;
    a gas feed unit operable to supply a gas into said vacuum chamber;
    a pump operable to evacuate said vacuum chamber;
    a dielectric body;
    a coil located on said dielectric body, said coil operable to generate plasma in said vacuum chamber;
    an electrode located in said vacuum chamber for placement of a substrate;
    a high frequency power source operable to supply high frequency power to said coil;
    a resistance-heating heater having a heating element that is shielded from the electromagnetic waves by a conductive sheath, said resistance-heating heater operable to heat said dielectric body; and a heater-use power source operable to supply a current to said resistance-heating heater.

29. A plasma processing apparatus claimed in claim 28, wherein said heating element of said resistance-heating heater is substantially uniformly disposed over substantially all of a surface of said dielectric body, including a vicinity of a center part of said dielectric body, and wherein said heating element is such that the current from said heater-use power source does not flow to said heating element in the vicinity of said center part of said dielectric body.

30. A plasma processing apparatus claimed in claim 29, further comprising an electrode power supply operable to supply high frequency power to said electrode.

31. A plasma processing apparatus claimed in claim 29, wherein said coil comprises multi-spirals.

32. A plasma processing apparatus claimed in claim 29, wherein said center part of said dielectric body is operable to prevent a temperature rise caused by said resistance-heating heater at said center part and operable to restrict heat generation thereby enhancing thermal uniformity of said dielectric body.

33. A plasma processing apparatus claimed in claim 29, wherein said center part occupies 5–20% of a total area of said dielectric body.

34. A plasma processing apparatus claimed in claim 28, wherein said heating element of said resistance-heating heater is substantially uniformly disposed over substantially all of a surface of said dielectric plate, and a low resistance conductor, located in a vicinity of a center of said dielectric plate, is connected to said heating element of said resistance-heating heater.

35. A plasma processing method according to claim 28, wherein said high frequency power source is capable of generating a frequency in a range of 3 MHz–3 GHz.

36. A plasma processing apparatus claimed in claim 28, wherein the following relation is satisfied:

$$Sy \times 0.6 > Sh$$

where $Sy$ is a total area of one face of said dielectric body, and $Sh$ is an area of a part of said one face of said dielectric body which is shielded by said resistance-heating heater from passing the electromagnetic waves.

37. A plasma processing apparatus claimed in claim 28, wherein said conductive sheath has an electric resistivity of $3 \times 10^{-8} \Omega \cdot m$ or lower.

38. A plasma processing apparatus claimed in claim 28, wherein said conductive sheath comprises gold, silver, copper or aluminum.

39. A plasma processing apparatus claimed in claim 28, further comprising a pressure-weld type thermocouple fitted at a side face of said dielectric body, said pressure-weld type thermocouple operable to adjust a temperature of said dielectric body while monitoring the temperature.

* * * * *